United States Patent
Pogge et al.

(10) Patent No.: US 7,071,031 B2
(45) Date of Patent: *Jul. 4, 2006

(54) THREE-DIMENSIONAL INTEGRATED CMOS-MEMS DEVICE AND PROCESS FOR MAKING THE SAME

(75) Inventors: H. Bernhard Pogge, Wappingers Falls, NY (US); Michel Despont, Adliswil (CH); Ute Drechsler, Kilchberg (CH); Peter Vettiger, Langnau am Albis (CH); Roy Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/446,461

(22) Filed: May 28, 2003

(65) Prior Publication Data

US 2004/0097004 A1 May 20, 2004

Related U.S. Application Data

(63) Continuation-in-part of application No. 10/294,140, filed on Nov. 14, 2002.

(51) Int. Cl.
H01L 21/44 (2006.01)
H01L 21/48 (2006.01)
H01L 21/50 (2006.01)

(52) U.S. Cl. ............... 438/109; 438/14; 438/15; 438/17; 438/50; 438/52; 438/460; 438/461; 257/254; 216/2; 216/52

(58) Field of Classification Search ........... 438/108, 438/14–17, 50–52, 460–462, 109; 257/254; 216/2, 52
See application file for complete search history.

(56) References Cited

U.S. PATENT DOCUMENTS

| | | | | | |
|---|---|---|---|---|---|
| 5,116,462 A | * | 5/1992 | Bartha et al. | ................ | 216/2 |
| 5,129,132 A | * | 7/1992 | Zdeblick et al. | ............ | 29/25.35 |
| 5,347,226 A | * | 9/1994 | Bachmann et al. | ......... | 324/724 |

(Continued)

FOREIGN PATENT DOCUMENTS

| EP | 1 014 094 | 6/2000 |
|---|---|---|
| EP | WO 02/10684 | 2/2002 |

OTHER PUBLICATIONS

"3–D Integration using wafer bonding," J–Q Lu et al.— Article—pp. 1–7.
"Ultrathin GaAs space solar cell devices," Hardingham et al.,1996 IEEE, 25th PVSC; May 13–17, 1996, Washington, DC.

(Continued)

Primary Examiner—Chandra Chaudhari
Assistant Examiner—Granvill D. Lee, Jr.
(74) Attorney, Agent, or Firm—Ira D. Blecker

(57) ABSTRACT

A vertically integrated structure includes a microelectromechanical system (MEMS) and a chip for delivering signals to the MEMS. The structure includes a metal stud connecting a surface of the chip and the MEMS; the MEMS has an anchor portion having a conducting pad on an underside thereof contacting the metal stud. The MEMS is spaced from the chip by a distance corresponding to a height of the metal stud, and the MEMS includes a doped region in contact with the conducting pad. In particular, the MEMS may include a cantilever structure, with the end portion including a tip extending in the vertical direction. A support structure (e.g. of polyimide) may surround the metal stud and contact both the underside of the MEMS and the surface of the chip. A temporary carrier plate is used to facilitate handling of the MEMS and alignment to the chip.

29 Claims, 28 Drawing Sheets

U.S. PATENT DOCUMENTS

| | | | | |
|---|---|---|---|---|
| 5,474,318 | A | * 12/1995 | Castellano | 280/284 |
| 5,534,466 | A | 7/1996 | Perfecto et al. | |
| 6,012,336 | A | * 1/2000 | Eaton et al. | 73/754 |
| 6,059,982 | A | * 5/2000 | Palagonia et al. | 216/11 |
| 6,087,638 | A | * 7/2000 | Silverbrook | 219/540 |
| 6,163,061 | A | * 12/2000 | Iida | 257/254 |
| 6,250,933 | B1 | * 6/2001 | Khoury et al. | 439/66 |
| 6,255,727 | B1 | * 7/2001 | Khoury | 257/693 |
| 6,294,101 | B1 | * 9/2001 | Silverbrook | 216/27 |
| 6,384,363 | B1 | 5/2002 | Xi-Qing et al. | |
| 6,448,103 | B1 | * 9/2002 | Thomas | 438/52 |
| 6,473,361 | B1 | * 10/2002 | Chen et al. | 365/244 |
| 6,531,327 | B1 | * 3/2003 | Kanamaru et al. | 438/17 |
| 6,548,841 | B1 | * 4/2003 | Frazier et al. | 257/254 |
| 6,583,411 | B1 | * 6/2003 | Altmann et al. | 250/306 |
| 6,586,133 | B1 | * 7/2003 | Teeters et al. | 429/152 |
| 6,645,145 | B1 | * 11/2003 | Dreschel et al. | 600/443 |
| 6,798,029 | B1 | * 9/2004 | Volant et al. | 257/415 |
| 2002/0096967 | A1 | * 7/2002 | Ma et al. | 310/309 |
| 2002/0105699 | A1 | 8/2002 | Claude et al. | |
| 2002/0113321 | A1 | 8/2002 | Oleg | |
| 2002/0135062 | A1 | 9/2002 | Ubaldo et al. | |
| 2004/0053434 | A1 | * 3/2004 | Bruner | 438/52 |

OTHER PUBLICATIONS

"Residual thermomechanical stresses in thinned-chip assemblies," Leseduarte et al., IEEE Transactiosn on componenets and packaging technologies, vol. 23, no. 4, Dec. 2000.

"High bandwith interconnects via a novel chip–stack package," Eric Beyne, IMEC, Leuven, Belgium, Solid State Technology, Apr. 2002 pp. S19–S22.

"The "Millipede"—more than one thousand tips for future AFM data storage," Vettiger et al., IBM Journal of Research and Development, vol. 44, no. 3, May 2000, pp. 323–338.

"VLSI–NEMS chip for parallel AFM data storage," Despont et al., Reprinted from Sensors and Actuators 80 (2000) 100–107.

"Automated handling of ultra–thin silicon wafers" F. A. Tony Schraub, Solid State Technology, Sep. 2002, pps. 59–64.

"Saving energy and natural resource by micro–nanomachining" Masayoshi Esashi, Technical Digest: 15th IEEE Conference on Micro–Electro Mechanical System, Las Vegas, NV, Jan. 20–24, 2002, pps. 220–227.

Title: The Millipede–More Than One Thousand Tips For Future AFM Data Storage Authors: P. Vettiger, M. Despont, U. Drechsier, U. Durig, W. Haberie, M.L. Lutwyche, H. E. Rothuizen, R. Stutz, R. Widner, May 2000 pp. 323–340, XP002194187 –ISSN: 0018–8646, Figures 1,5,7.

"Automated handling of Ultra–thin silicon wafers" F.A. Tony Schraub, Solid State Technology, Sep. 2002, pp. 59–64

"Saving energy and natural resource by micro–nanomachining" Masayoshi Esashi Technical Digest: 15th IEEE Conference on Micro–Electro Mechanical System, Las Vegas, NV, Jan. 20–24, 2002, pp. 220–227.

* cited by examiner

THREE-DIMENSIONAL INTEGRATED CMOS-MEMS DEVICE AND PROCESS FOR MAKING THE SAME

RELATED APPLICATION

This application is a continuation-in-part of application Ser. No. 10/294,140, filed Nov. 14, 2002.

FIELD OF THE INVENTION

This invention relates to the manufacture of very large-scale integrated devices including CMOS logic devices and micro-electromechanical (MEMS) devices for the next generation of data storage. In particular, the invention relates to fabrication of three-dimensional device structures, where those structures include CMOS and MEMS chips or combinations of other types of chips.

BACKGROUND OF THE INVENTION

The use of micro-electromechanical systems (MEMS) and nano-electromechanical systems (NEMS) for ultrahigh density data storage has recently been reported. This approach to data storage utilizes a thermomechanical local probe technique with large arrays of nanometer-scale tips, such as are now used in atomic-force microscope and scanning-tunneling microscope technology. In this technique, a read/write operation is performed by heating a cantilever mechanism, causing a tip to contact a thin film storage medium and either create or detect depressions made therein. Some details of the design of MEMS structures for data storage have been recently published in IBM J. Res. Develop. 44, 323 (2000) and in Sensors and Actuators 80, 100 (2000).

An individual cantilever cell is shown schematically in FIG. 1A (cross-section view) and FIG. 1B (plan view). The MEMS chip 1, typically of silicon, is processed to yield a silicon cantilever 10 with a tip 11 and a heater 13. As shown in FIG. 1A, the cantilever structure 10 is formed on a layer at the surface of chip 1, and a cavity is then etched in the bulk silicon behind cantilever 10. Applying electrical power via the through connection 15 causes a temperature increase in the heater and tip, which is in contact with storage medium 12 (typically a thin polymer film on a silicon substrate). The combination of tip pressure on the storage medium and the tip heating causes the tip to create an indentation in the storage medium, thereby realizing thermomechanical data writing with very high bit areal densities.

A conventional 2-dimensional arrangement for controlling the MEMS chip 1 is shown schematically in FIG. 2. The MEMS chip 1, which includes a large number of individual cells, is electrically controlled by multiplex drivers 2 having conventional wirebonding connections to the edge of chip 1. There are limitations inherent in the 2-dimensional arrangement of electrical connections. For example, as the number of cells in chip 1 increases, it becomes more difficult to provide electrical isolation between cells; at the same time, higher power is required to address the cell array while the size of individual connections decreases.

Accordingly, there is a need for a 3-dimensional integration scheme in which MEMS devices and their control devices (such as CMOS logic chips) may be interconnected, in order to overcome the electrical limitations of the conventional 2-dimensional configuration.

SUMMARY OF THE INVENTION

The present invention addresses the above-described need by providing a method for integrating a chip having a micromechanical device and a chip having an electronic device. In particular, the invention provides a method for vertical integration of a chip and a MEMS where the MEMS may make contact with a surface (such as the surface of a film serving as a storage device) and have mechanical motion with respect to that surface in the vertical direction.

According to one aspect of the invention, a method is provided for fabricating an integrated structure including a micro-electromechanical system (MEMS) and a chip for delivering signals to the MEMS. The MEMS is formed on the surface of a MEMS substrate; the MEMS includes an anchor portion. At least part of the MEMS (including part of the anchor portion) is processed so as to form a conductor through the anchor portion; the MEMS substrate is then removed, thereby exposing an underside of the MEMS and the conductor. The conductor may be formed, for example, by an ion implant process. A conducting structure (a metal pad or stud) is formed on the underside of the MEMS, in contact with the conductor in the anchor portion. The chip is then attached to the anchor portion of the MEMS in a direction normal to the surface, so as to make a conductive path from the chip to the MEMS. In one particular embodiment of the invention, the MEMS includes a cantilever structure which extends horizontally from the anchor portion and has a tip which extends in the vertical direction (that is, in the direction normal to the surface). Prior to removing the MEMS substrate, a first layer may be deposited overlying the MEMS, and a carrier plate may be attached to the first layer. A second layer may be deposited on the chip, with a metal stud formed in an opening therein; the chip may then be attached by aligning the metal stud to the conductor at the underside of the MEMS, and performing a lamination process to bond the MEMS to the second layer.

According to another aspect of the invention, a method is provided for fabricating an integrated structure including a micro-electromechanical system (MEMS) and a chip for delivering signals to the MEMS, in which a MEMS is formed on a MEMS substrate, the MEMS having an anchor portion; the MEMS substrate is removed, thereby exposing an underside of the MEMS; and a conducting pad is formed on the underside of the MEMS. The chip is then attached to the anchor portion of the MEMS, so as to make a conductive path from the chip to the MEMS in a direction normal to the surface. A dopant material may be implanted in at least part of the MEMS to form a doped region therein; the conducting pad is afterwards formed in contact with the doped region. The MEMS may advantageously be formed from the silicon layer overlying the insulator in a silicon-on-insulator (SOI) wafer.

Prior to removing the MEMS substrate, a first layer (e.g. polyimide) may be deposited overlying the MEMS, and a carrier plate may be attached to the first layer. The carrier plate is preferably transparent to ablating radiation; after the step of attaching the chip, the carrier plate is exposed to ablating radiation, thereby detaching the carrier plate from the first layer; the first layer may then be removed.

The chip may be attached to the MEMS by first forming a metal stud on the chip; aligning the metal stud to the conducting pad; then performing a lamination process in which the conducting pad of the MEMS is connected to the metal stud. The metal stud may be formed by depositing a second layer on the chip; forming an opening in the second layer; and then forming the metal stud in the opening in the second layer.

Furthermore, a support structure may be formed on the underside of the MEMS after forming the conducting pad and before the step of attaching the chip; the support structure is brought into contact with the chip during the attaching step. The MEMS is spaced from the chip by a distance corresponding to a height of the support structure. In particular, the support structure may include a support which surrounds the metal stud after the chip is attached to the MEMS. At least part of the support structure may be removed after the chip is attached; the support structure is preferably of polyimide, so that the first layer overlying the MEMS and part of the support structure underlying the MEMS may both be removed in the same process (typically an ashing process). Alternatively, an etch stop layer may be deposited over the MEMS before the first layer, so that the support structure is not removed during the removal process for the first layer.

According to an additional aspect of the invention, a vertically integrated structure is provided in which a microelectromechanical system (MEMS) and a chip for delivering signals to the MEMS are connected. The structure includes a metal stud on a surface of the chip and the MEMS; the MEMS has an anchor portion and an end portion extending horizontally therefrom, the anchor portion having a conducting pad on an underside thereof contacting the metal stud. The MEMS is spaced from the chip by a distance corresponding to a height of the metal stud, and the MEMS includes a doped region in contact with the conducting pad. In particular, the MEMS may include a cantilever structure, with the end portion including a tip extending in the vertical direction. A support structure (e.g. of polyimide) may surround the metal stud and contact both the underside of the MEMS and the surface of the chip. In addition, the structure may include a layer of nitride overlying at least part of the MEMS.

DETAILED DESCRIPTION OF PREFERRED EMBODIMENTS

Figure 1A:
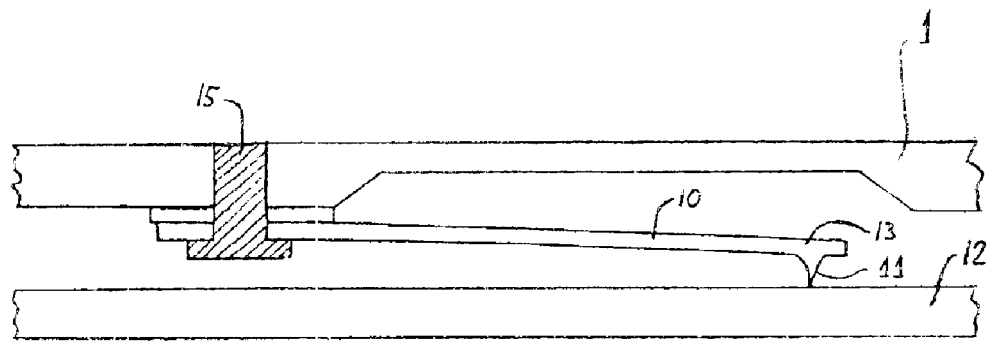
FIG. 1A is a schematic cross-sectional view of a cell of a MEMS chip used for data storage.
Figure 1B:
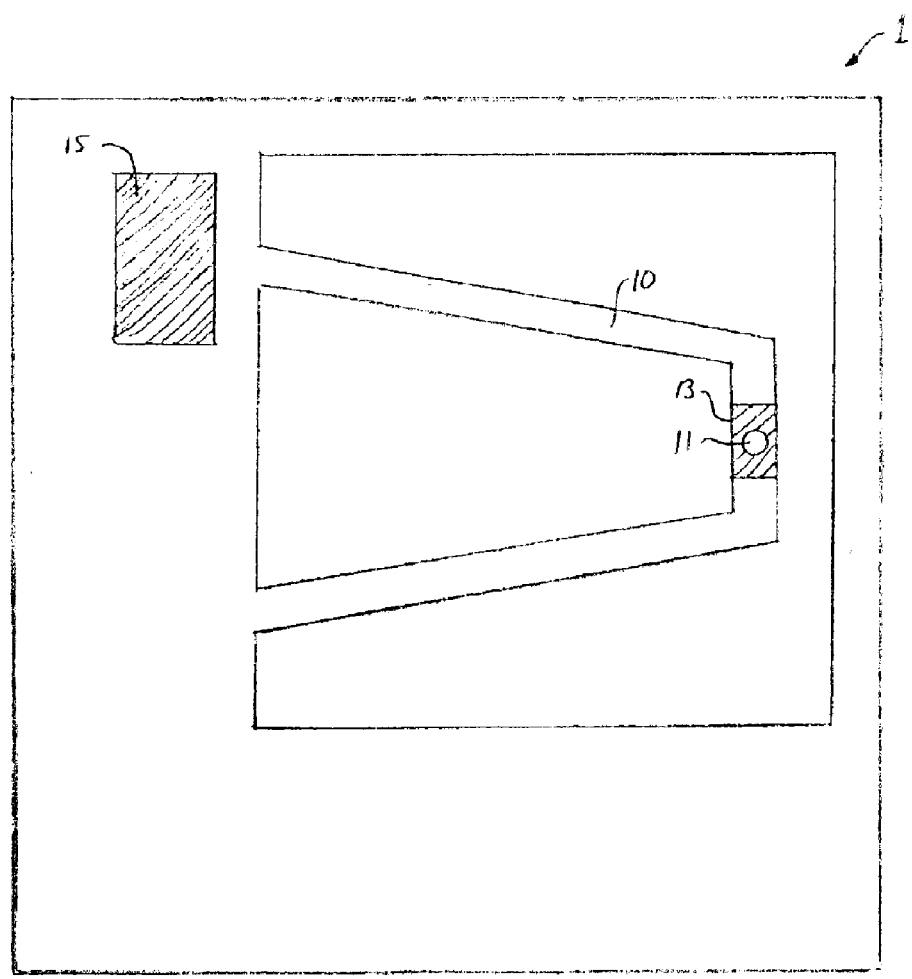
FIG. 1B is a plan view of the cell of FIG. 1A.
Figure 2:
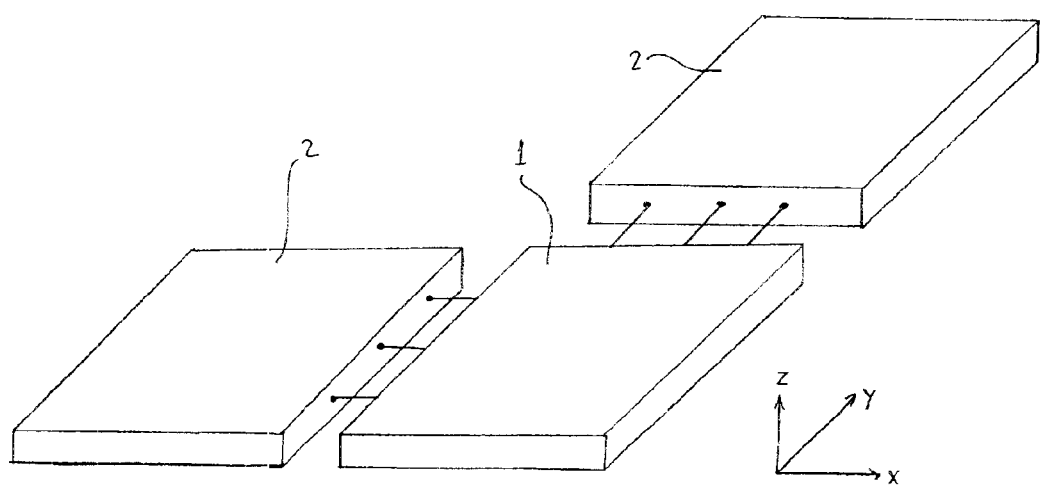
FIG. 2 is a schematic view of a conventional 2-dimensional arrangement for connecting a MEMS chip to driver chips.
Figure 3:
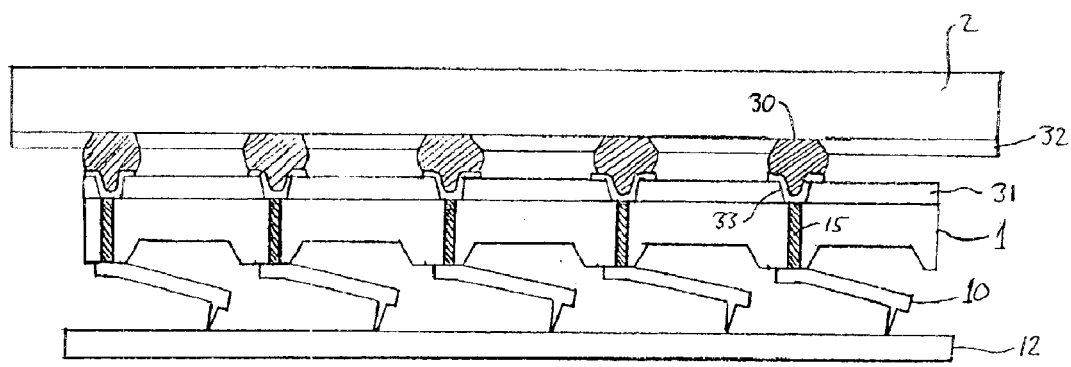
FIG. 3 is a cross-sectional view of a completed 3-dimensional integrated MEMS/CMOS device where the connection between MEMS and CMOS chips is realized using C4 technology.

FIG. 3 illustrates an embodiment of the invention wherein a memory storage device includes 3-dimensional integration of a MEMS chip 1 and a CMOS chip 2, and where the connections between the chips are made using C4 technology. The MEMS chip has an array of cantilevers 10 aligned to an array of C4 solder bumps 30 on the CMOS chip. The cantilevers 10 on the MEMS chip make contact with the storage medium 12. Movement of the cantilevers is controlled by the CMOS chip; connection between an individual cantilever and the CMOS chip is through an electrical pathway which includes interconnect 15 through the MEMS chip, pad 33 formed on a polyimide layer 31 on the backside of the MEMS chip, and the C4 solder bump 30. (The solder bump is connected to a pad, not shown, formed on a polyimide layer 32 on the CMOS chip 2.)

Figure 4:
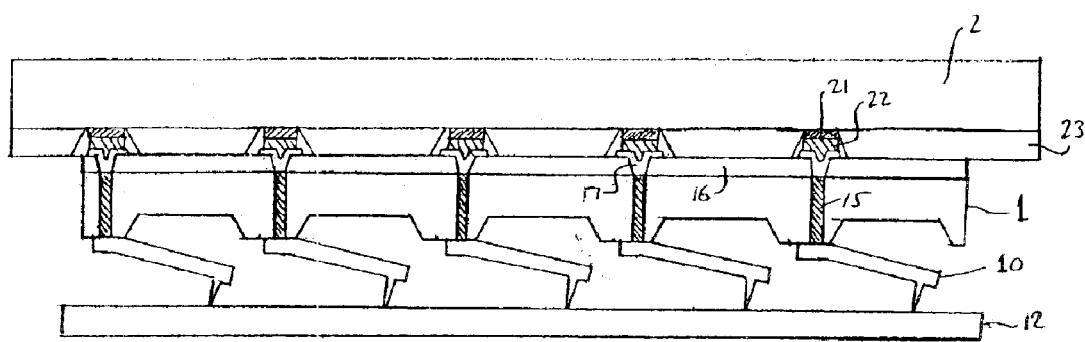
FIG. 4 is a cross-sectional view of a completed 3-dimensional integrated MEMS/CMOS device where the connection between MEMS and CMOS chips is realized using vertical stud/via connections.

FIG. 4 illustrates another embodiment of the invention, wherein a memory storage device is fabricated by integrating a MEMS chip 1 and a CMOS chip 2 using vertical stud/via connections. The MEMS chip has an interconnect 15 through the chip and a coating 16 of polyimide on the backside of the chip; electrical contact to the MEMS chip is through pads 17 formed in openings in the polyimide coating. The CMOS chip 2 also has a polyimide coating 23 on the backside thereof, with openings to match the locations of pads 17. The CMOS chip has studs 21 in those openings, with solder 22 providing a conductive connection between the pads 17 and the studs. The polyimide layers 16, 23 on the MEMS chip and CMOS chip are in mechanical contact, so that the chips are both physically and electrically integrated.

Details of the processes for 3-dimensional integration of MEMS and CMOS chips are given below. It will be appreciated that the MEMS cantilever structure is an example only, and that the invention is applicable to a variety of micro-electromechanical devices.

Preparation of MEMS Chip with Through-wafer Via Connection

Figure 5A:
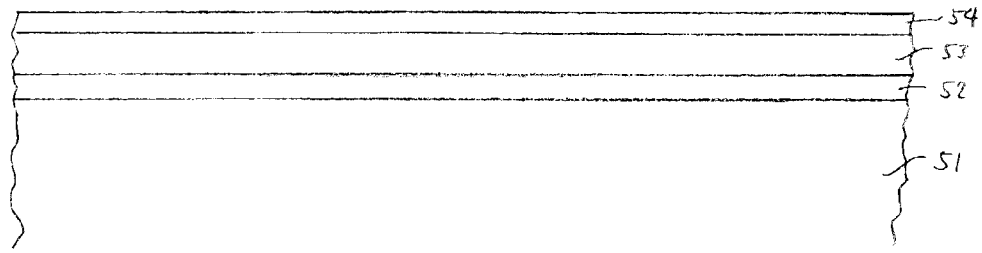
FIGS. 5A–5F illustrate steps in the fabrication of a MEMS chip having through-wafer connections, in accordance with an embodiment of the invention.
Figure 5B:
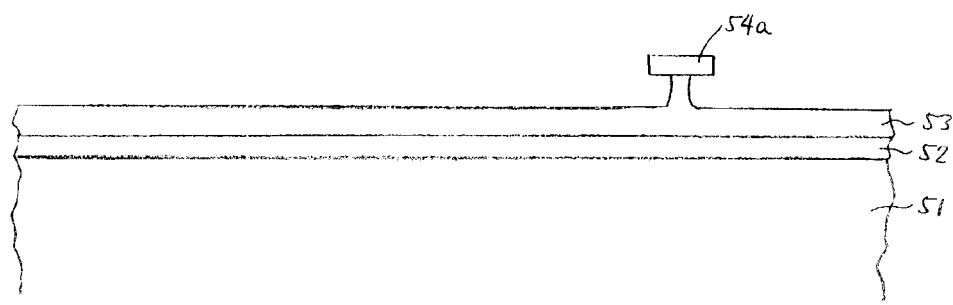
Figure 5C:
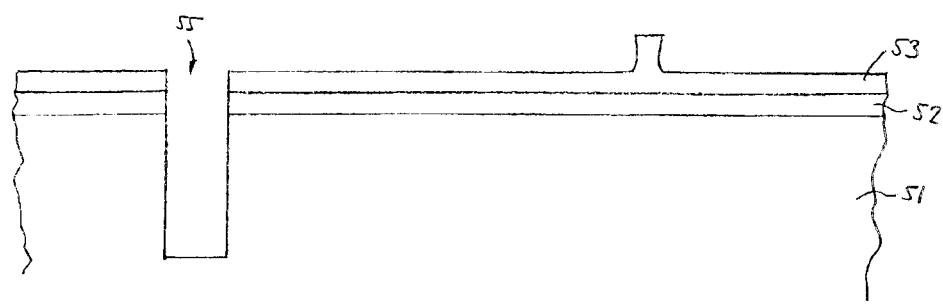

In accordance with an embodiment of the present invention, a MEMS chip having an array of silicon cantilevers is prepared as shown in FIGS. 5A–5F. FIG. 5A shows a silicon-on-insulator (SOI) wafer having a buried oxide (BOX) layer 52 on bulk silicon 51, silicon layer 53 overlying the BOX, and a thermal oxide layer 54. Typical thicknesses of layers 52–54 are 400 nm, 4 µm and 500 nm respectively. Oxide layer 54 is then masked and etched so that only a portion 54a remains, which in turn serves as a mask for etching of silicon layer 53 (see FIG. 5B). The masked portion of the silicon layer is processed later to form the nanometer-scale tip. A deep via opening 55 is then etched into the substrate 51; the dimensions of this via are in accordance with available lithography and the design of the MEMS cell (FIG. 5C).

Figure 5D:
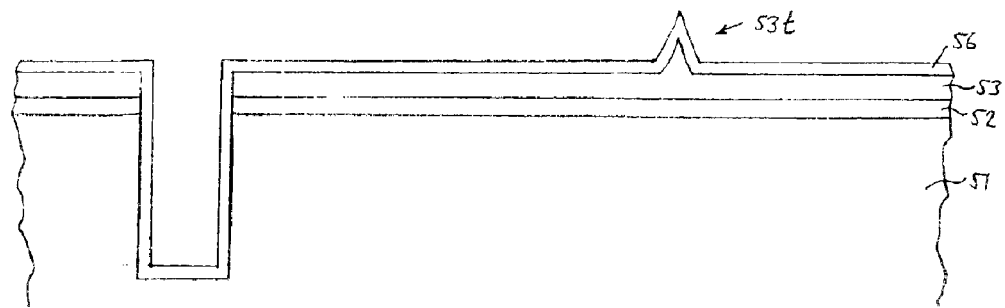
Figure 5E:
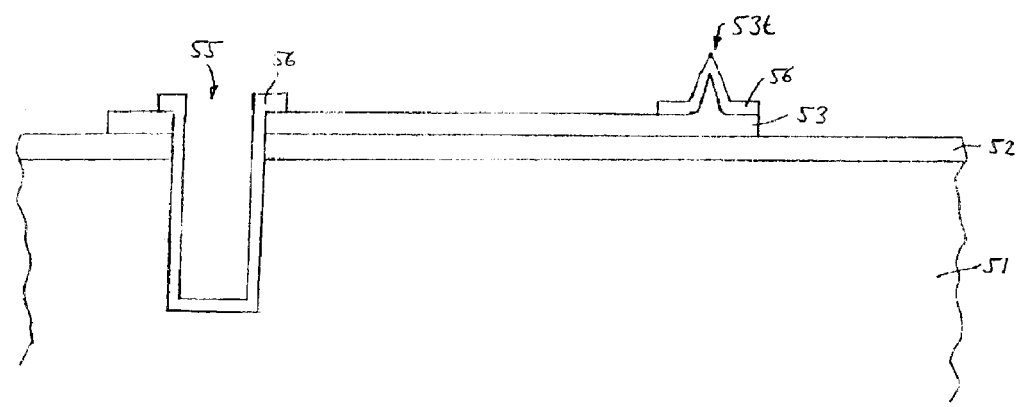

A thermal oxide layer 56 is then grown on silicon layer 53 and on the side wall of opening 55. The small unetched portion of layer 53 is partially consumed in the oxidation process, which has the effect of sharpening the silicon to a tip 53t (FIG. 5D). Layers 53 and 56 are then etched to form the cantilever structure including the heater, with the tip 53t still protected by oxide (FIG. 5E).

The etched via opening 55 is then filled with metal 57 which will form the through-connection. A contact pad 58 is then deposited over the top of the via and on the adjacent silicon, at the end of the cantilever opposite the tip. Another oxide layer 59 (preferably low-temperature oxide) is deposited as a blanket layer, and an opening 60 is then etched down to the surface of substrate 51 (see FIG. 5F).

At this point the MEMS structure is ready to have the cavity etched in the substrate (thereby releasing the cantilever tip end from the substrate), and to be thinned in preparation for joining to the CMOS device. These steps may be performed in two different ways, as shown in FIGS. 6A–6C and 7A–7C respectively.

Figure 5F:
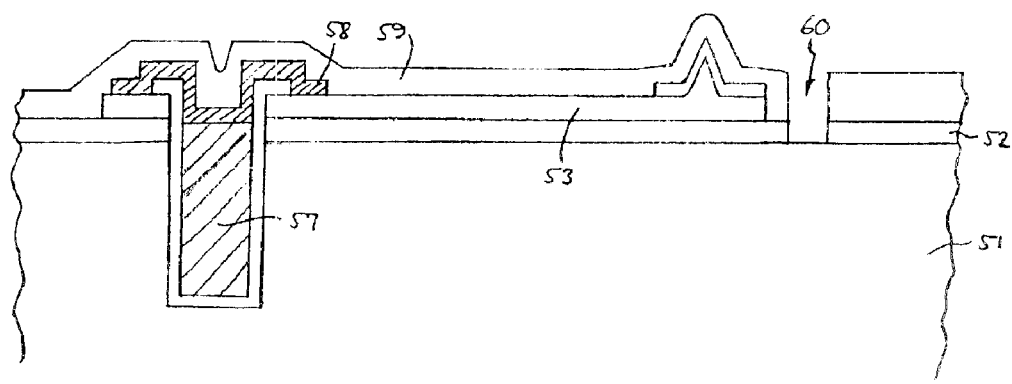
Figure 6A:
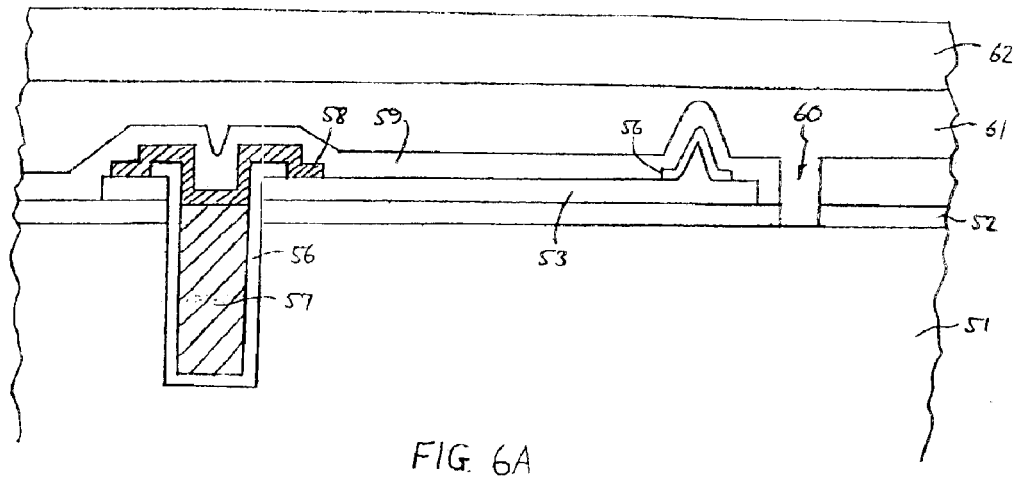
FIGS. 6A–6C illustrate further steps in the fabrication of a MEMS chip, following the steps shown in FIGS. 5A–5F.
Figure 6B:
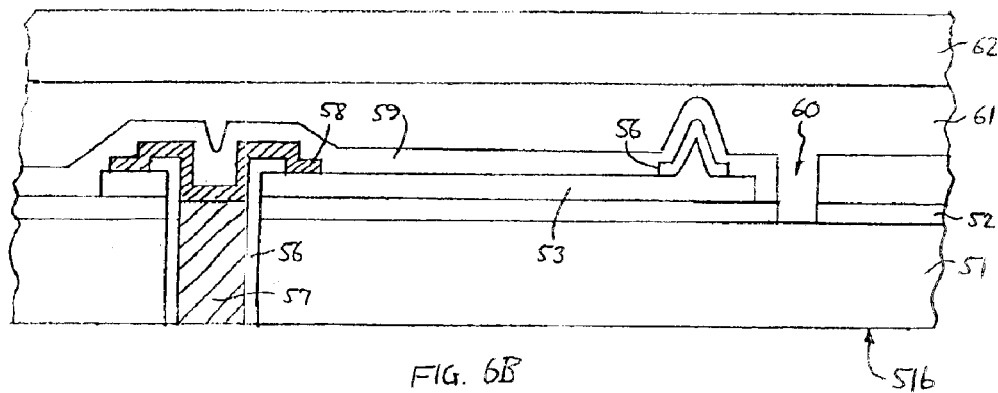
Figure 6C:
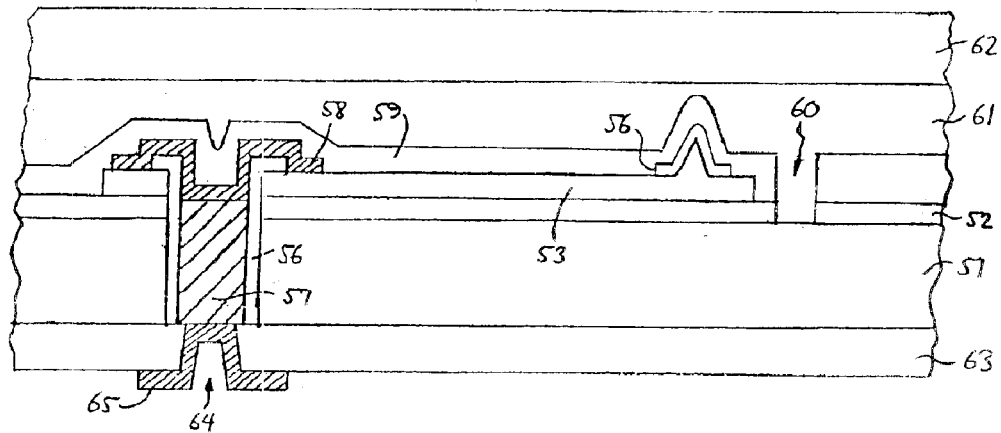

(1) FIG. 6A shows the structure of FIG. 5F first covered by a polyimide layer 61 and then having a carrier plate 62 bonded to the polyimide. The carrier plate is used to facilitate handling of the MEMS substrate after the substrate is thinned. It is preferable that the carrier be transparent to ablating radiation (e.g. a glass wafer) so that it can be conveniently removed afterwards. The MEMS substrate is then thinned in a grinding or polishing operation, so that the electrical through-connection is exposed on the backside surface 51b of the substrate (FIG. 6B). A polyimide layer 63 is then deposited on the backside of the substrate, and has openings 64 formed therein to expose the metallization 57. Metal pads 65 are then formed in the openings to contact metal 57 and complete the through-connection (FIG. 6C). The cavity etch is performed through opening 60 after the carrier 62 and polyimide layer 61 are removed. This structure is suitable for integration with a CMOS chip using stud/via connections, as described in more detail below.

Figure 7A:
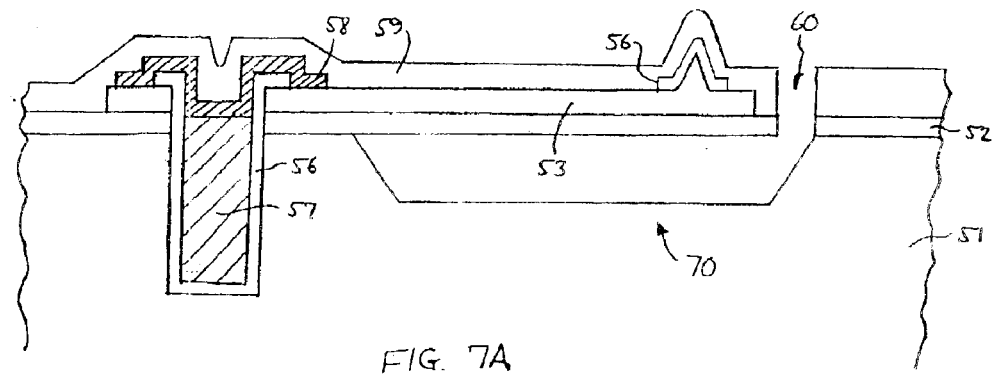
FIGS. 7A–7C illustrate an alternative to the process of FIGS. 6A–6C in fabricating a MEMS chip.
Figure 7B:
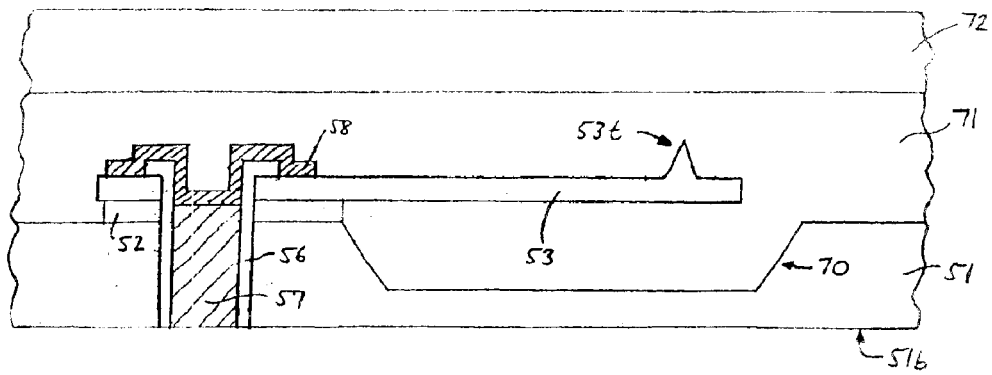
Figure 7C:
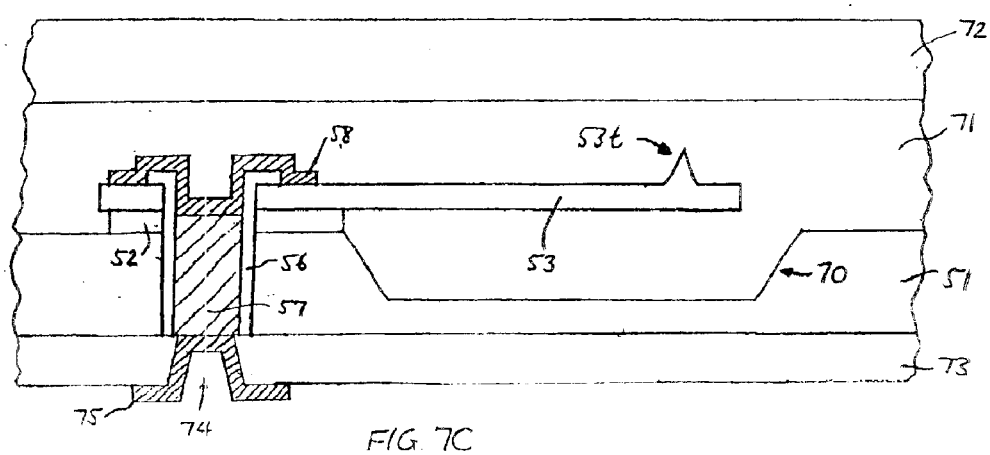

(2) FIG. 7A shows the structure of FIG. 5F, after the cavity etch is performed in the substrate 51 (using cavity opening 60 and layer 59 as a mask). The oxide layer 59 and BOX layer 52 are then etched; in particular, BOX layer 52 is etched at its underside through cavity 70, so that the remaining portion of silicon layer 53 becomes a cantilever overhanging cavity 70 (FIG. 7B). The top surface of the MEMS structure (including the cavity) is then covered with a polyimide layer 71, and a carrier plate 72 is bonded thereto. As noted above, the carrier plate is preferably transparent (e.g. a glass wafer). After the carrier is attached, the substrate is thinned so that metal 57 is exposed on the backside surface 51b of the substrate. This backside surface is then coated with a polyimide layer 73, which has openings 74 formed therein; metal pads 75 are formed in the openings to contact metal 57 (FIG. 7C). This MEMS structure is suitable for integration with a CMOS device using C4 connections, as follows.

MEMS/CMOS Integration Using C4

Figure 8A:
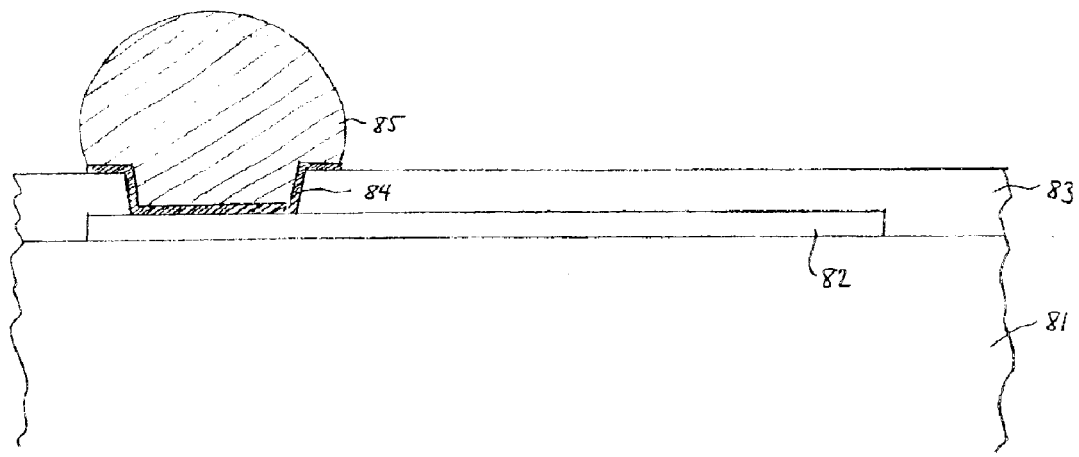
FIGS. 8A–8C illustrate steps in the 3-dimensional integration of a MEMS chip and a CMOS chip, using C4 connections.
Figure 8B:
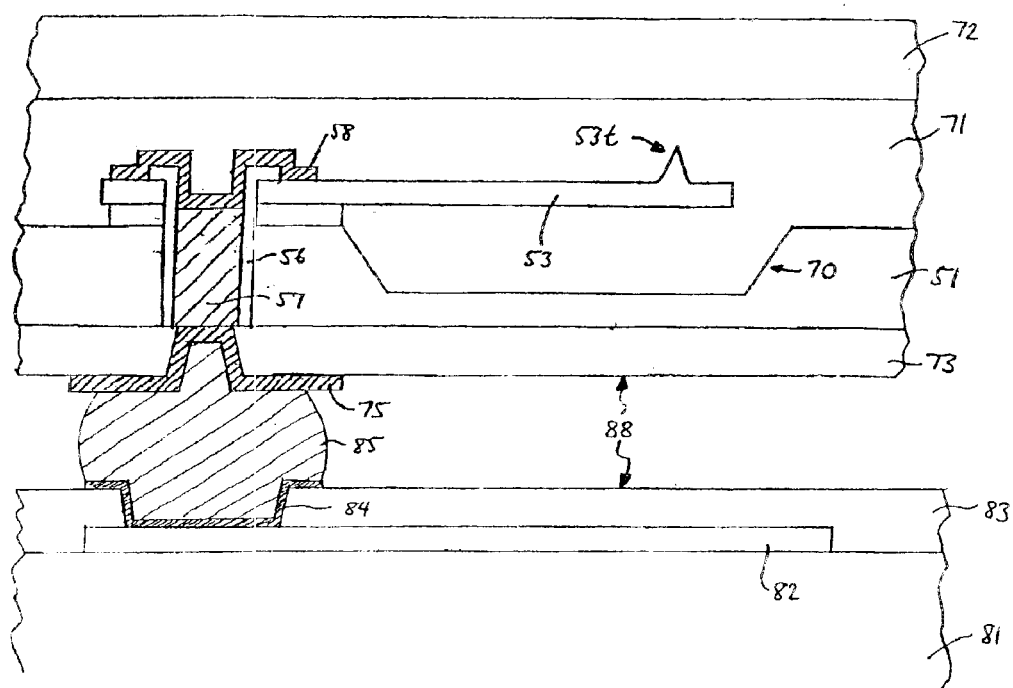
Figure 8C:
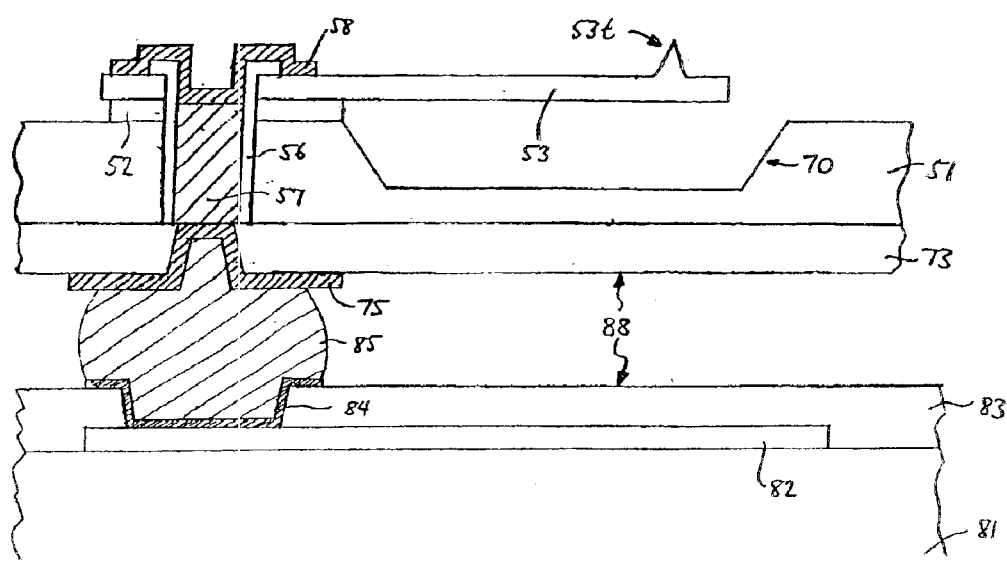

A process for MEMS/CMOS integration using C4 connections is shown in FIGS. 8A–8C. In FIG. 8A, CMOS substrate 81 is shown with a metal pad 82 on the surface thereof and a polyimide layer 83 overlying the substrate surface. (It is understood that the electronic devices for controlling the MEMS chip have already been fabricated and are part of the CMOS substrate 81; those CMOS devices will not be discussed in detail.) As understood by those skilled in the art, a C4 connection is prepared by forming an opening in the polyimide layer 83 to expose pad 82, depositing a seed layer 84 in the opening, and plating C4 metal through a mask. The mask and excess seed layer are then removed, and a reflow process is performed to yield the C4 bonding pad 85.

The MEMS chip (shown with the cavity 70 already formed, in accordance with FIG. 7C) is then aligned to the CMOS chip (using carrier 72) and bonded to the C4 pads. Specifically, pad 75 on the backside of the MEMS chip is bonded to the C4 pad 85, so that an electrical and thermal through-connection is made from the CMOS chip through the MEMS chip and to the cantilever structure (see FIG. 8B). Details of the C4 bonding process are known in the art.

The carrier 72 is then detached from polyimide layer 71 (preferably by laser ablation of the interface between the carrier and polyimide layer 71) and removed from the front side of the MEMS chip. Polyimide layer 71 is then removed, yielding the structure shown in FIG. 8C. It should be noted that in this embodiment, there is a gap 88 between opposite polyimide layers 73 and 83 on the MEMS and CMOS chips respectively.

MEMS/CMOS Integration Using Stud/Via Connections

Figure 9A:
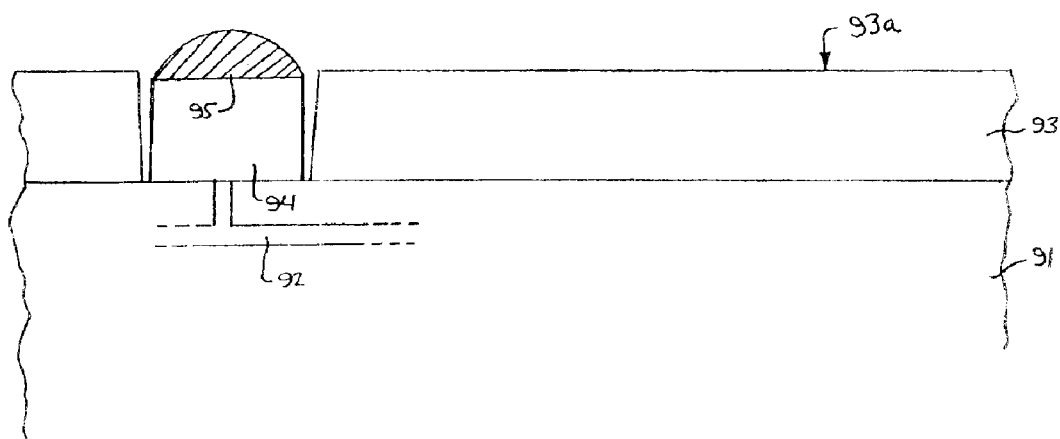
FIGS. 9A–9D illustrate steps in the 3-dimensional integration of a MEMS chip and a CMOS chip, using stud/via connections.

FIG. 9A shows a CMOS substrate 91, with electronic devices assumed to be already fabricated therein. Wiring connections 92 to the top surface of substrate 91 are shown in FIG. 9A. The substrate is covered by a polyimide layer 93, with openings formed therein to make connection to the CMOS devices. As shown in FIG. 9A, the openings are preferably tapered to facilitate alignment to the MEMS chip. Studs 94 are built in the openings, making electrical contact with wiring 92. The studs are capped with solder 95 for making connection to the metal pads on the MEMS chip. The thickness of polyimide layer 93 is chosen so that when the CMOS and MEMS chips are bonded together, surface 93a contacts the MEMS chip while a solder joint is formed electrically connecting the chips.

Figure 9B:
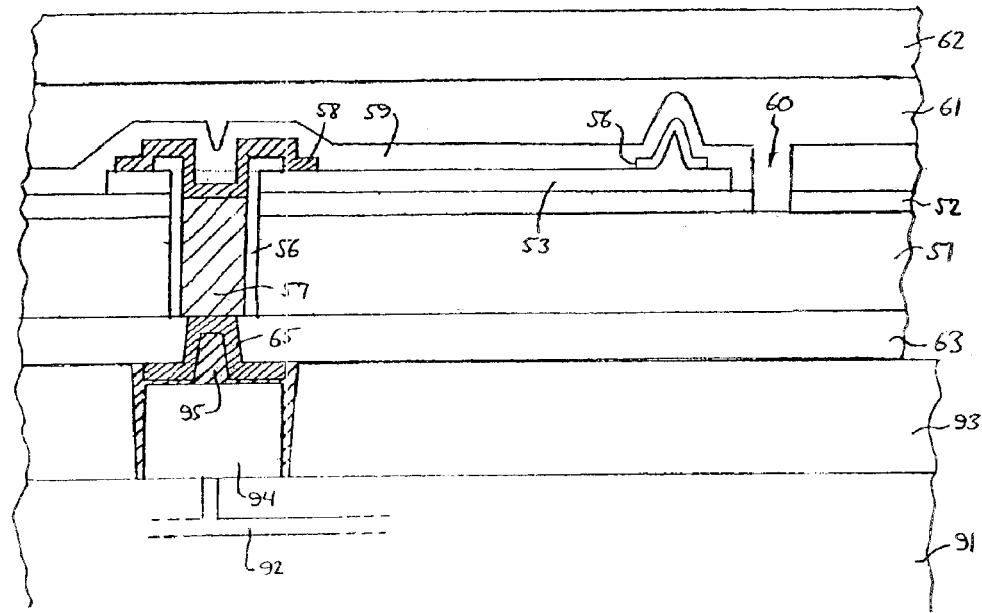

FIG. 9B shows the MEMS chip (processed in accordance with FIG. 6C) aligned and bonded to the CMOS chip. With presently available techniques, this alignment may be performed accurately to less than 1 μm. Polyimide layer 63 on the backside of the MEMS chip is brought into contact with polyimide layer 93 on the CMOS chip. Bonding pad 65 on the MEMS chip, which is in contact with the metallized via 57, is aligned to the stud 94. A high-temperature lamination process is then performed in which solder 95 is caused to flow, filling the opening in the polyimide layer and bonding to pad 65. It should be noted that in this embodiment, the opposing polyimide layers 63, 93 are in contact with no gap between the chips. One or both of polyimide layers 63, 93 may be coated with an adhesive before the lamination process is performed.

Figure 9C:
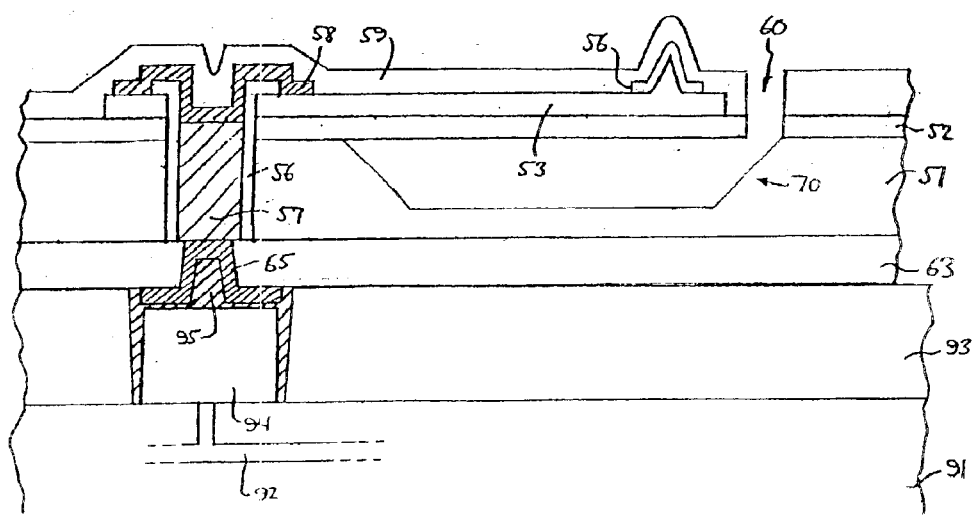

After the bonding process, the carrier 62 is removed from polyimide layer 61, preferably by laser ablation. Polyimide layer 61 is then removed to expose the cavity etch opening 60. The cavity etch processes are then performed to remove silicon from behind the cantilever structure (FIG. 9C); oxide layers 52, 56, 59 are then etched to expose the cantilever and cantilever tip. The completed MEMS/CMOS integrated structure is shown in FIG. 9D.

Figure 9D:
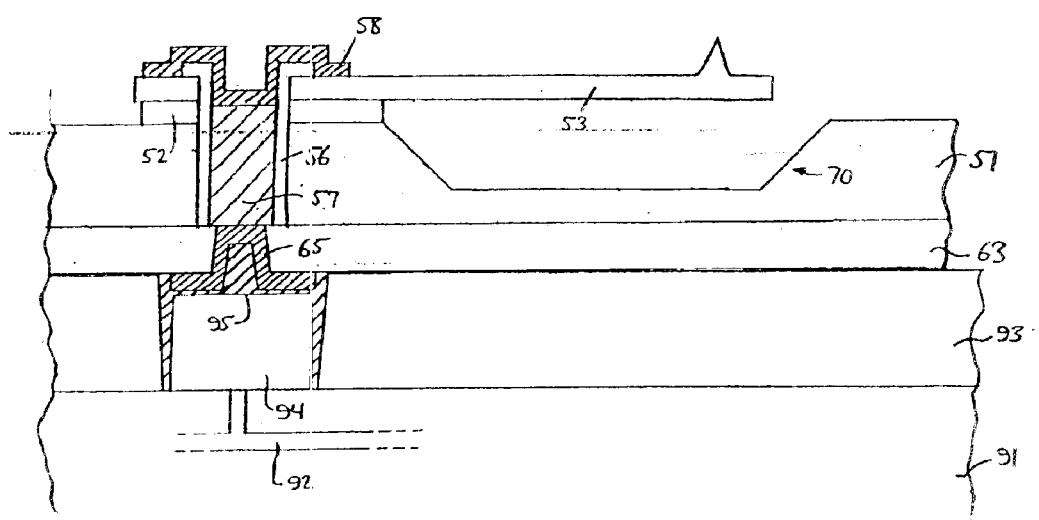
Figure 9E:
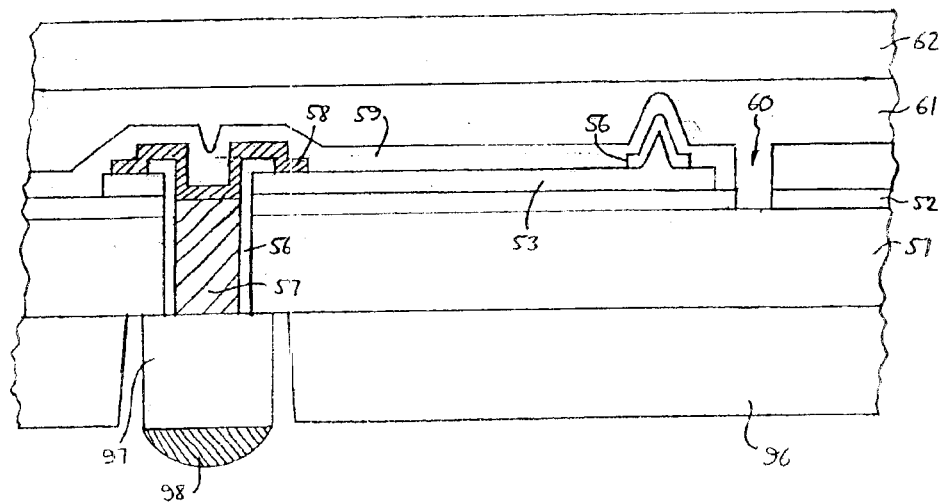
FIGS. 9E–9G illustrate steps in the 3-dimensional integration of a MEMS chip and a CMOS chip, using an alternative stud/via connection process.
Figure 9F:
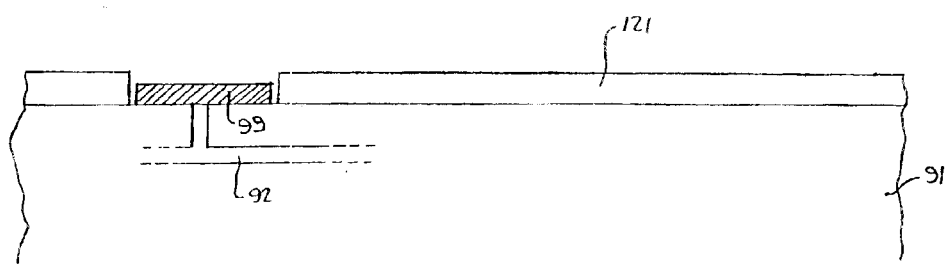
Figure 9G:
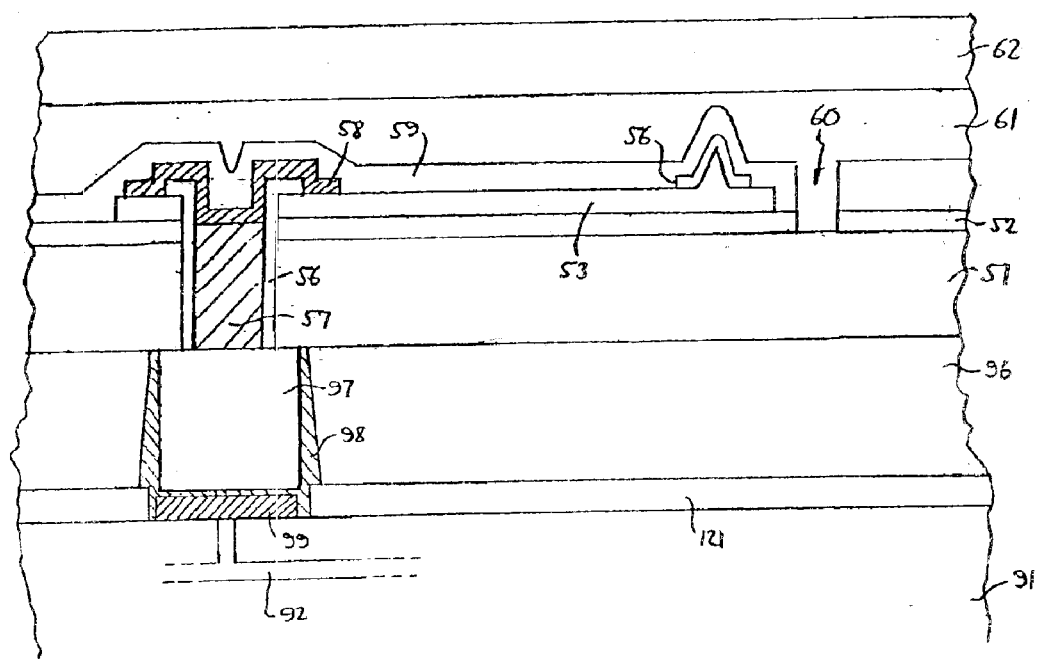

An alternative stud/via connection process is shown in FIGS. 9E–9G. In this process the studs are located on the MEMS chip instead of CMOS chip. As shown in FIG. 9E, the backside of the MEMS chip (shown here processed as in FIG. 6B) is covered by a polyimide layer 96 and has openings formed therein. Studs 97 are then built in the openings and capped with solder 98 for making connection to the CMOS chip. Polyimide layer 96 is formed with a thickness so as to ensure that a solder connection is made between the chips while layer 96 is brought into contact with the CMOS chip. The CMOS chip 91 has a polyimide layer 121 formed thereon, with openings for making electrical connections to the CMOS devices. Bonding pads 99 are formed in these openings, making electrical contact with wiring 92 (FIG. 9F; compare FIG. 9A). The MEMS chip and CMOS chip are then brought into contact with pad 99 aligned to stud 97, as shown in FIG. 9G (compare FIG. 9B). A high-temperature lamination process is performed as described above, so that solder 98 bonds to pad 99. One or both of polyimide layers 96, 121 may be coated with an adhesive before the lamination process is performed. After the bonding process, processing of the MEMS/CMOS integrated structure is completed as described above.

More generally, it will be appreciated that whenever a stud/via connection process is used to join two structures (such as the backside of a MEMS and the top or device side of a CMOS), the stud may be formed on either of the two structures, with the pad (to which the stud connects) being formed on the other. The layer (typically polyimide) which separates the two structures, and surrounds the stud after the lamination process is completed, may be formed either on the same surface as the stud or on the opposite surface (in which case the connecting pad is formed at the bottom of a via in the layer). This flexibility in the location of stud and via applies to all of the stud/via processes described herein.

As shown in FIGS. 8C, 9D and 9G, the above-described processes yield a 3-dimensional integrated MEMS/CMOS structure in which electrical signals travel in the z-direction through the MEMS chip (that is, in the same direction in which the cantilever tip is actuated).

Cantilever/CMOS Direct Contact Using Via Opening in Cantilever

Figure 10:
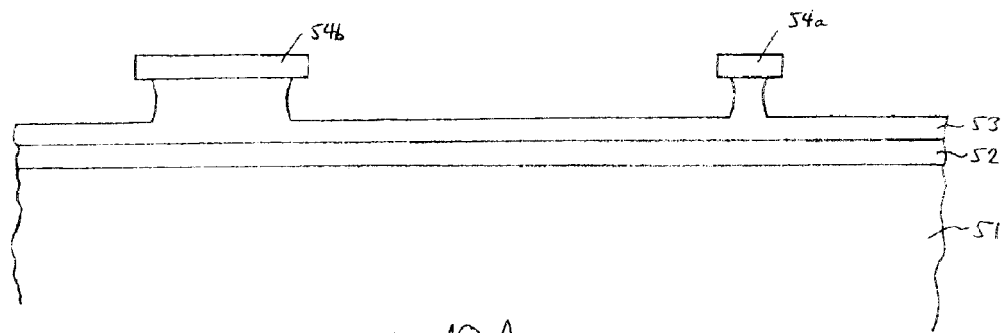
FIGS. 10A–10G illustrate steps in the 3-dimensional integration of MEMS devices with a CMOS chip, where electrical and thermal contact is made from the CMOS chip directly to a cantilever, in accordance with another embodiment of the invention.
Figure 10:
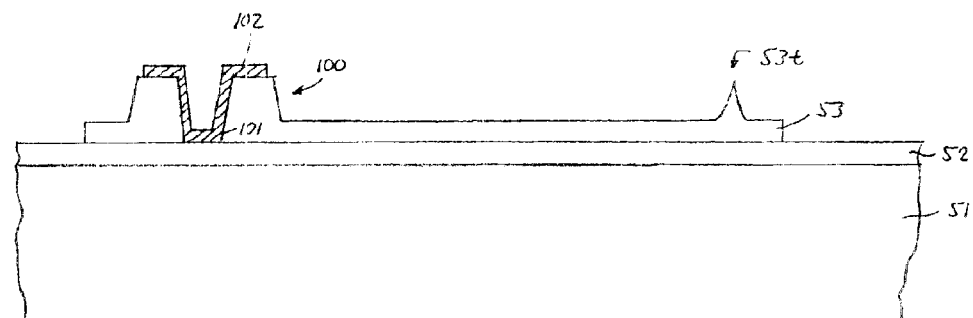
Figure 10:
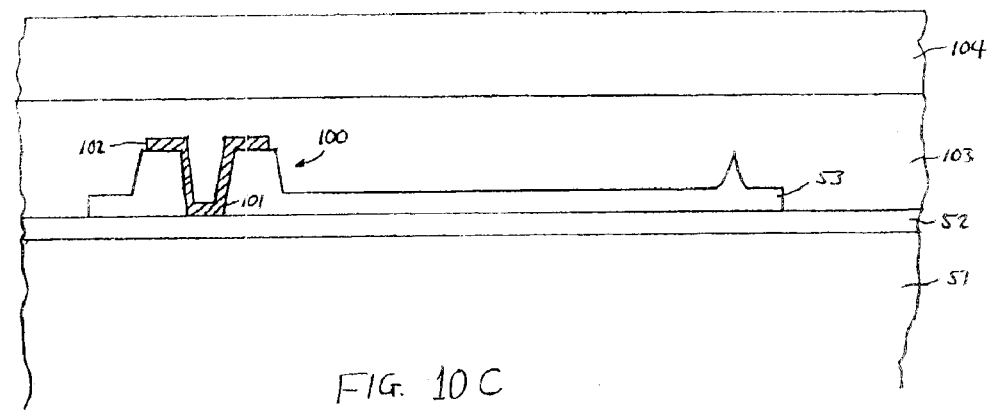

In another embodiment of the invention, electrical and thermal contact is made from the CMOS chip directly to the cantilever, without a through-wafer connection; the cantilever structure is anchored to a stud/via arrangement directly connected to the CMOS chip. Fabrication of the cantilever begins with an SOI wafer as previously discussed with reference to FIG. 5A. The oxide layer 54 is masked and etched so that portions 54a and 54b remain, as shown in FIG. 10A; the underlying silicon layer 53 is then etched. The unetched silicon areas are then processed to form the cantilever tip and anchor ends.

The cantilever tip 53t is sharpened by thermal oxidation of the silicon layer 53; the silicon layer is then patterned to form the cantilever, as shown in FIG. 10B. In particular, the anchor portion 100 of the cantilever has a via opening 101 formed therein, so that a portion of the underlying BOX layer 52 is exposed. A metal layer 102 is then formed in the via opening. This structure is then coated with a polyimide layer 103, and a carrier plate 104 is attached thereto (see FIG. 10C).

Figure 10D:
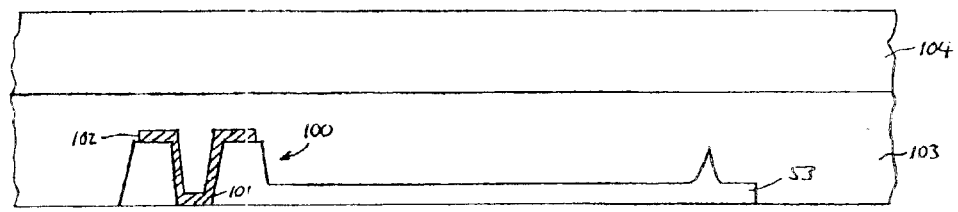

The silicon substrate 51 is then removed by a grinding, polishing, wet etch or plasma etch process. The BOX layer 52 is also removed, by either a wet etch or plasma etch process. The resulting structure is shown in FIG. 10D.

Figure 10E:
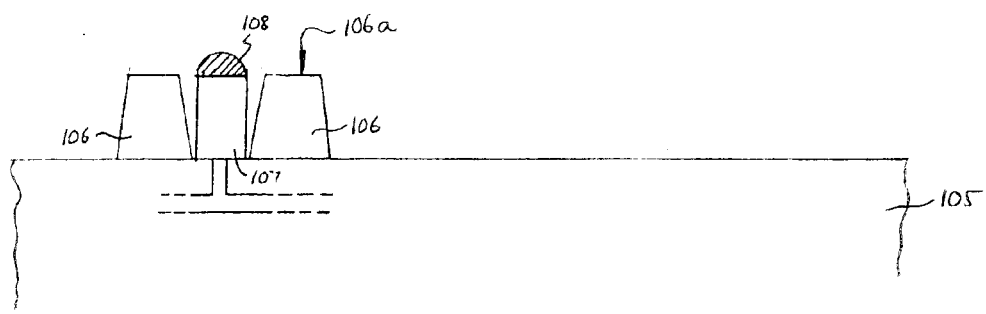

The CMOS chip is prepared as shown in FIG. 10E. As noted above, it is assumed that the CMOS substrate 105 has electronic devices formed therein with wiring connections at the surface of the substrate. An inorganic layer 106, 1 μm to 2 μm thick, is deposited on the substrate surface and patterned to form a structure having an opening exposing the wiring connection. A stud 107 is formed in the opening with solder 108 on top of the stud; the thickness of layer 106 is chosen to ensure that a solder connection is made to the MEMS device (as discussed above with reference to FIG. 9A).

Figure 10F:
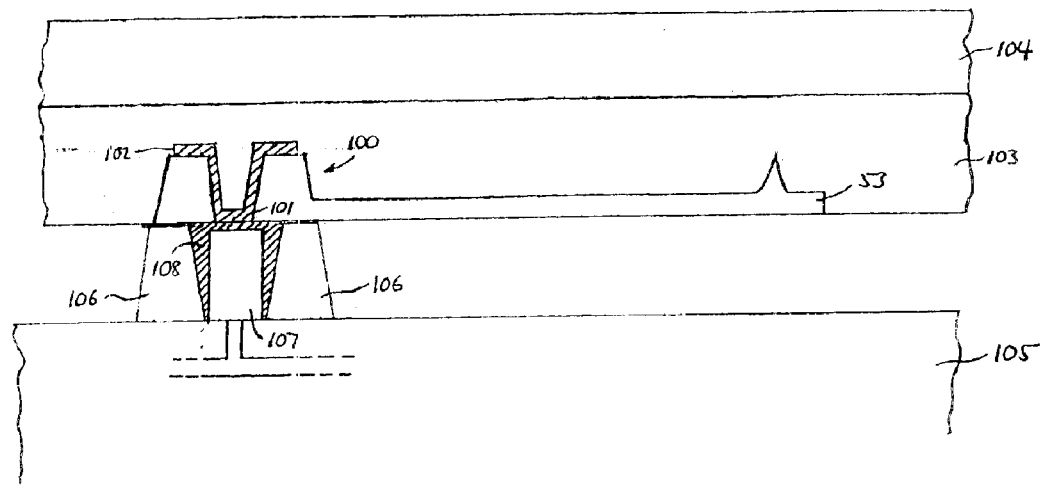
Figure 10G:
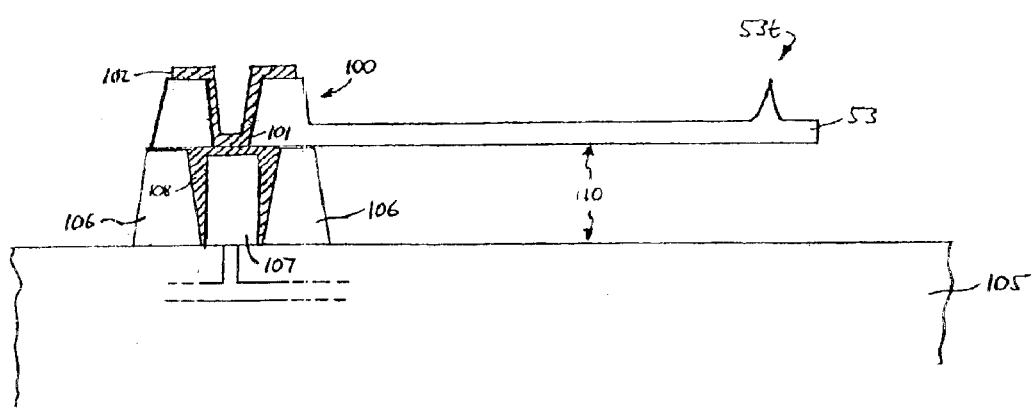

The MEMS chip and CMOS chip are then brought into alignment, with the anchor portion 100 of the cantilever contacting the top surface 106a of the patterned inorganic layer 106. A high-temperature lamination process is then performed in which the solder 108 is caused to flow, thereby establishing electrical and thermal contact between stud 107 and the metal pad 102 in the anchor portion 100 of the cantilever. The resulting structure is shown in FIG. 10F. The carrier plate 104 is then detached from the polyimide layer 103 (preferably by laser ablation, as discussed previously) and removed. Finally, the polyimide layer 103 is stripped away, preferably with a plasma process. As shown in FIG. 10G, the result of this process is an integrated structure where an array of separate MEMS devices are connected in the z-direction to a CMOS chip, without the need for through-connections in a MEMS substrate. Whereas in the previous embodiments it was necessary to etch a cavity 70 in the substrate to provide a range of vertical motion for the tip, in this embodiment a spacing 110 is established between the chip and the cantilever in accordance with the thickness of layer 106.

Cantilever/CMOS Direct Contact Using Implanted Conductor in Cantilever

Figure 11A:
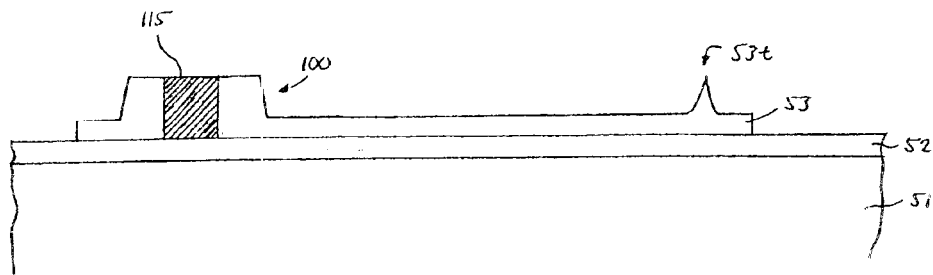
FIGS. 11A–11C illustrate an alternative process for forming a direct contact between a CMOS chip and a MEMS device having a cantilever.
Figure 11B:
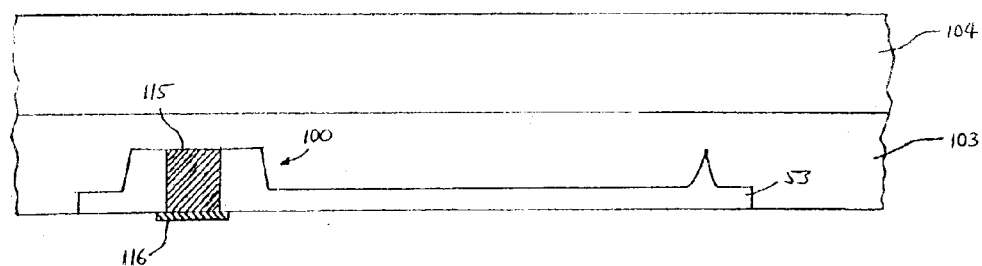
Figure 11C:
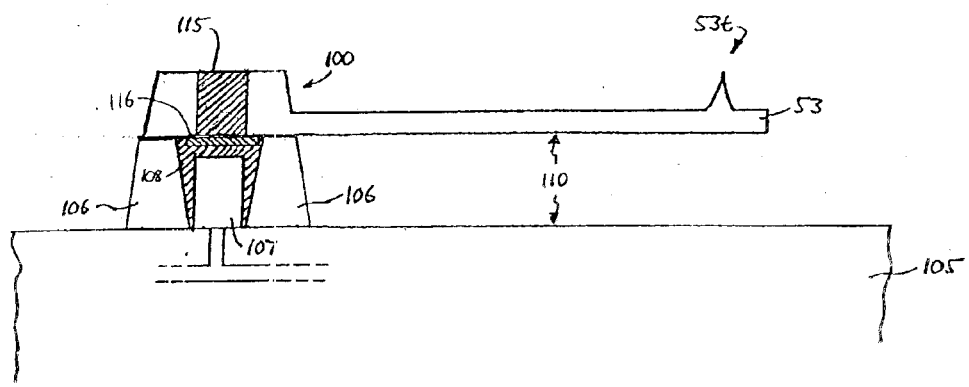

An alternative to the process described just above is shown in FIGS. 11A–11C. After the anchor portion 100 of the cantilever is formed, an ion implant process is performed so that an implanted region 115 is formed in the anchor (FIG. 11A; compare FIG. 10B). The implanted region 115 serves as a conductor for connecting to the CMOS chip. The MEMS chip and CMOS chip are then processed similarly to FIGS. 10C–10D, so that the backside (underside) of the cantilever structure is exposed. A conducting pad 116, for making electrical and thermal connection to the CMOS chip, is then formed on the backside of the anchor portion under the implanted region 115 (FIG. 11B). The structure is then laminated as described above. The finished structure is shown in FIG. 11C. (Although FIG. 11C shows a stud formed on the CMOS chip in the opening of layer 106, it will be appreciated that a stud could alternatively be formed on the underside of the MEMS anchor portion, in contact with region 115, and then brought into contact with a pad on the CMOS chip surface in the opening of layer 106.) The CMOS chip makes electrical and thermal contact to the implanted conducting region 115 of the cantilever through the stud 107, solder 108 and pad 116.

Preparation of MEMS Chip with Doped Cantilever and Backside Conductor

Figure 12A:
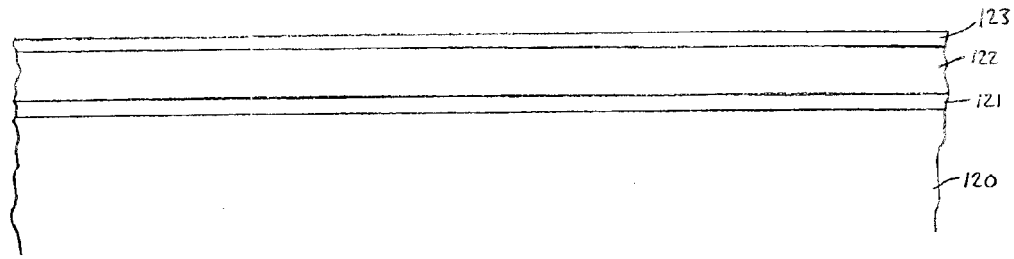
FIGS. 12A–12E illustrate a process for fabricating a MEMS chip having a cantilever of a doped semiconductor material, in accordance with a further embodiment of the invention.
Figure 12B:
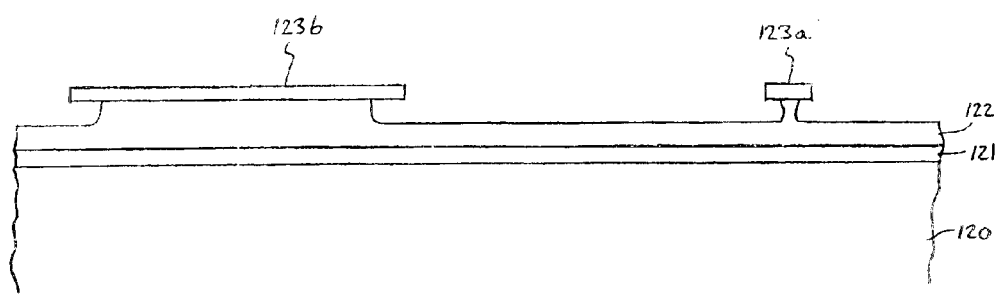

In accordance with another embodiment of the invention, a MEMS chip having an array of silicon cantilevers is prepared as shown in FIGS. 12A–12E. FIG. 12A shows a silicon-on-insulator (SOI) wafer having a buried oxide (BOX) layer 121 on bulk silicon 120, silicon layer 122 overlying the BOX, and a thermal oxide layer 123. Typical thicknesses of layers 121–123 are 400 nm, 1.4 μm and 500 nm respectively. Oxide layer 123 is then masked and etched so that only portions 123a and 123b remain, which in turn serve as a mask for etching of silicon layer 122 (see FIG. 12B). The remainder of oxide layer 123 is removed after this silicon etch is complete.

Figure 12C:
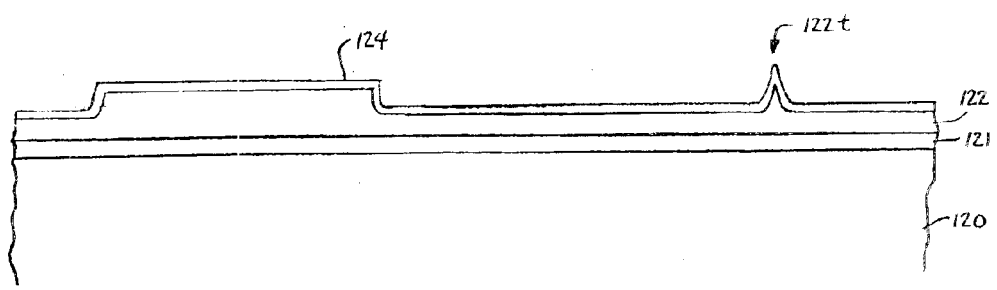
Figure 12D:
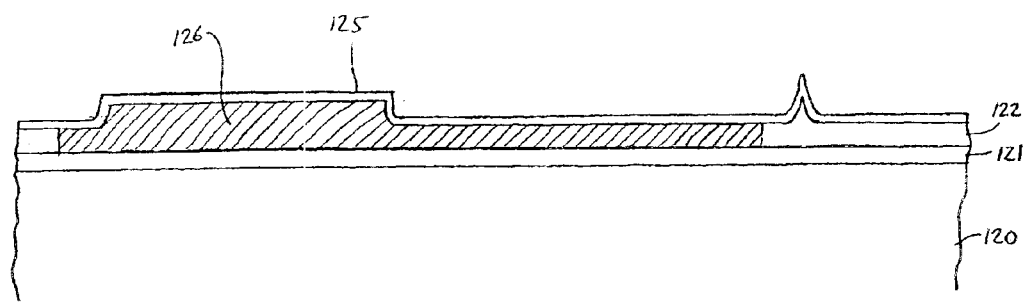
Figure 12E:
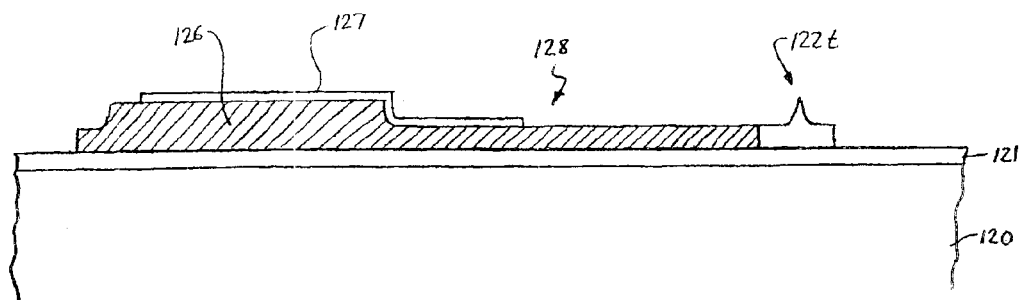

The unetched portions of the silicon layer 122 (those portions masked by oxide portions 123a and 123b) are then processed to form the cantilever tip and cantilever anchor portion respectively. A thermal oxide layer 124 is grown on silicon layer 122. The small unetched portion of layer 122 in the tip region is partially consumed in the oxidation process, which has the effect of sharpening the silicon to a tip 122t (FIG. 12C). Oxide layer 124 is then removed by a convenient process (such as a buffered HF strip), and a thin thermal oxide layer 125 (about 50 nm thick) is grown on the silicon surface. An ion implant process (including implantation and drive-in, preferably with a phosphorus-bearing species) is then performed with a blockout mask (not shown) and oxide layer 125 as a screen, to form a doped region 126 (FIG. 12D). Oxide layer 125 is then removed, typically in a BHF strip process. The silicon layer 122 is then patterned and etched to form the individual cantilever structures 128 on the wafer (FIG. 12E). A layer 127 of silicon nitride may be advantageously deposited (preferably by PECVD) and then patterned to cover a portion of cantilever 128, as shown in FIG. 12E, to improve the mechanical performance of the cantilever.

Figure 13A:
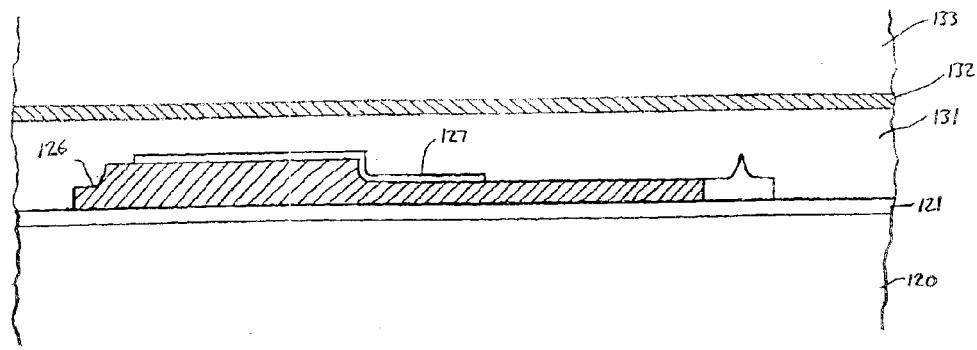
FIGS. 13A–13C illustrate steps in a process for forming a conducting pad on the backside of the MEMS cantilever of FIG. 12C.

The SOI wafer, now having cantilever structures formed thereon, is then attached to a carrier plate. This is preferably done by depositing an adhesive polyimide layer 131 over the cantilever structures (e.g. by a spin-on and curing process), and then laminating the polyimide with a Teflon® sheet 132 and a glass plate 133. The resulting structure is shown in FIG. 13A.

Once the cantilever structure 128 is secured to the carrier plate, it may then be released from the underlying wafer. The wafer is lapped or etched from the backside to remove the bulk Si layer 120, thus exposing the underside of oxide layer 121. The oxide layer is then removed by a convenient process such as a BHF etch. This process exposes the underside of the cantilever structure.

Figure 13B:
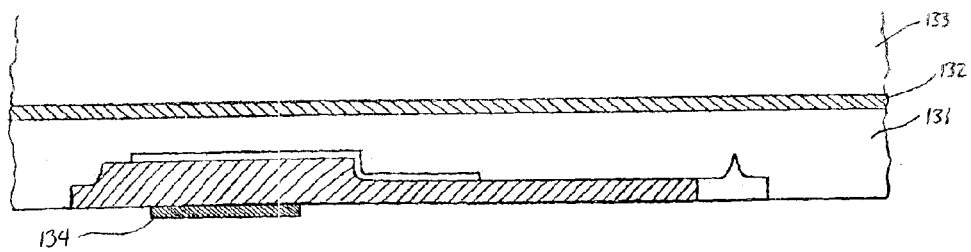

A conducting pad 134, for making electrical and thermal contact to the cantilever, is then formed on the backside of the anchor portion of the MEMS device (see FIG. 13B). This may be done by depositing a metal layer (typically Ni) on the underside of the MEMS devices and polyimide layer 131, and then patterning the metal layer to yield a pad under each anchor portion. An additional polyimide layer 135 and adhesive layer 136 are then deposited on the underside of the structure; these layers are patterned and cured to form a support 137 surrounding pad 134 (see FIG. 13C). The structure of FIG. 13C, including the carrier plate, the MEMS device and the polyimide support, are then ready to be laminated to the CMOS device wafer. The height of the support 137 (that is, the thickness of layers 135, 136) determines the distance between the CMOS chip and the MEMS device.

Preparation of CMOS Devices for Joining to MEMS with Backside Conductor

Figure 14A:
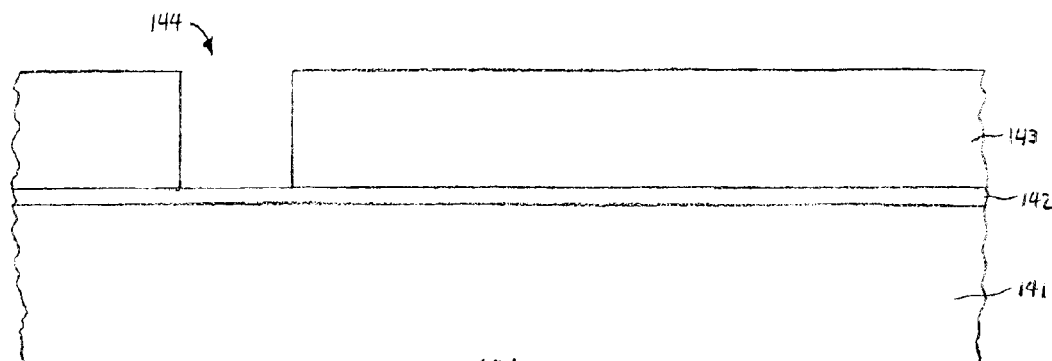
FIGS. 14A–14C illustrate steps in a process for forming an interconnect on a CMOS chip for connection to a MEMS chip such as shown in FIG. 13C.
Figure 14B:
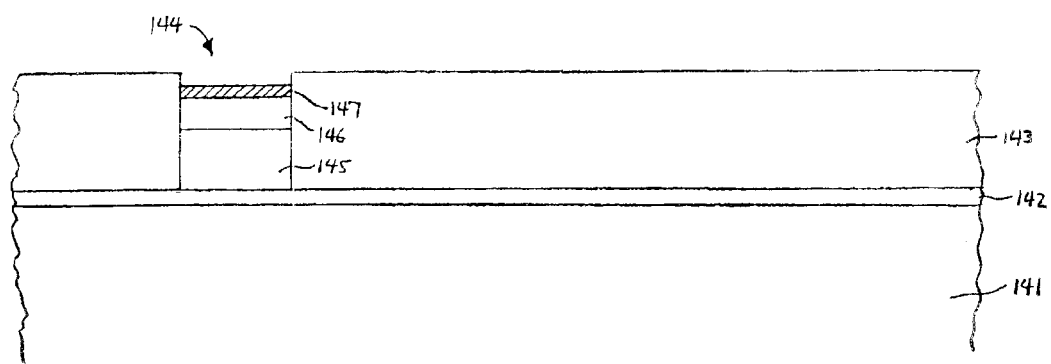
Figure 14C:
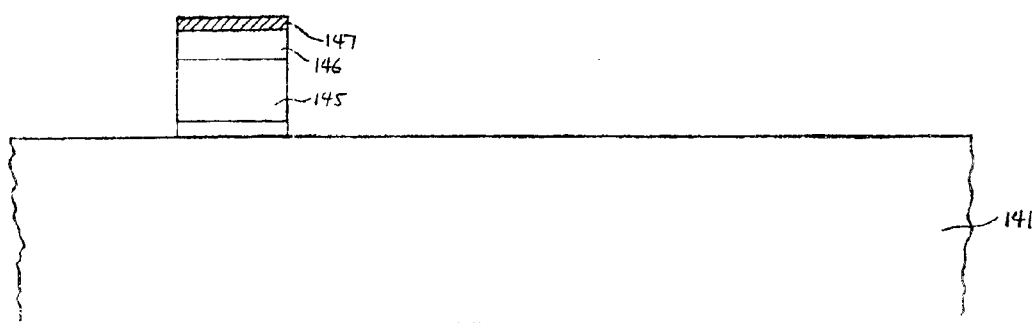

FIGS. 14A–14C illustrate steps in a process for preparing a CMOS device wafer for connecting to a cantilever structure having a backside conducting pad 134 and polyimide support 137. Wafer 141 (having CMOS devices already formed therein) is coated with a plating seed layer 142. Typically the seed layer 142 includes a thin layer of Cr in contact with the device wafer, a layer of Cr/Cu alloy, and a layer of Cu for plating. A resist layer 143 is then deposited to serve as a plating mask, with an opening 144 formed therein (see FIG. 14A). A plating process is then performed to make a metal contact to the MEMS device; a layer 145 of Cu is formed on the seed layer, followed by deposition of a Au layer 146 and a layer of solder 147, as shown in FIG. 14B. The resist layer is then removed, and the underlying seed layer is etched away (typically by an ion milling process). A conducting stud is thus formed on the surface of the CMOS wafer, as shown in FIG. 14C.

Figure 13C:
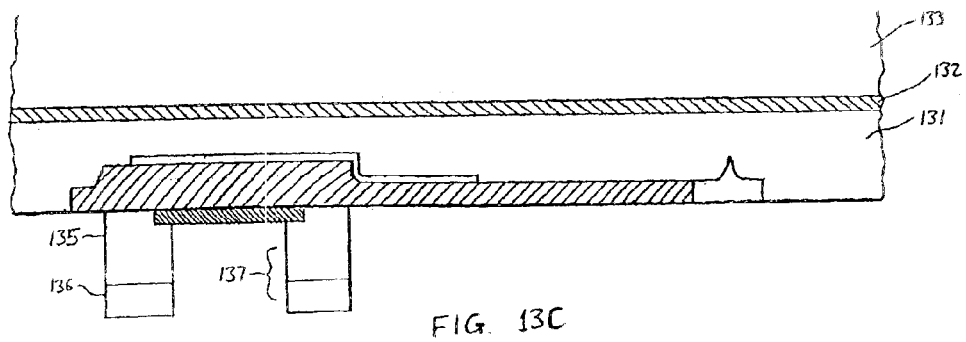
Figure 15A:
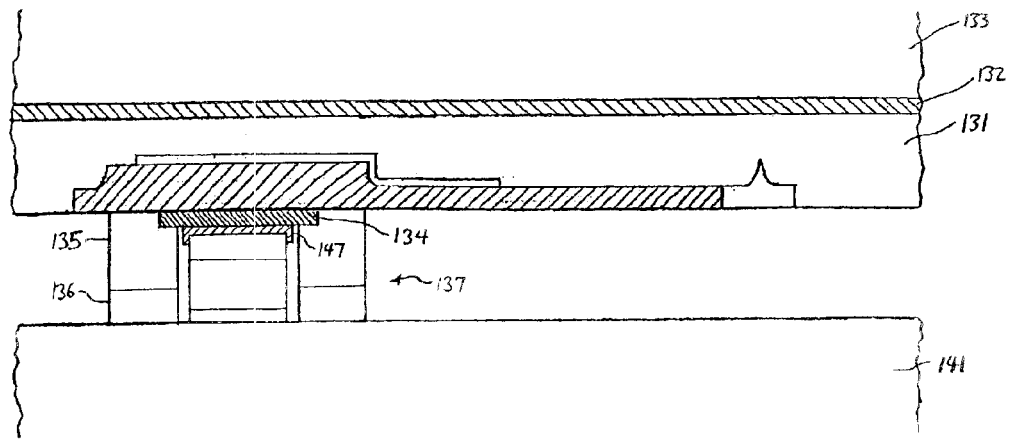
FIGS. 15A and 15B illustrate steps in the 3-D integration of a MEMS chip and a CMOS chip, using a MEMS cantilever with backside conductor as shown in FIG. 13C and a CMOS interconnect structure as shown in FIG. 14C.
Figure 15B:
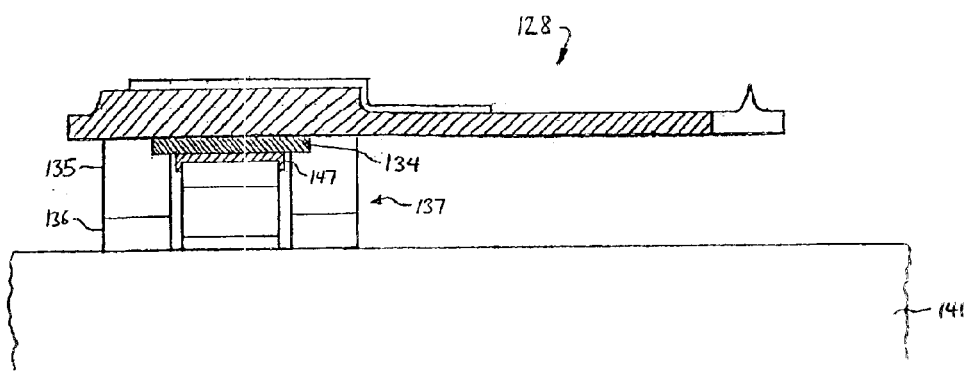

The MEMS structure of FIG. 13C and the CMOS structure of FIG. 14C are then joined together in a lamination process, during which adhesive layer 136 contacts the CMOS wafer and a solder joint is formed between solder layer 147 and conducting pad 134, as shown in FIG. 15A. (The thicknesses of layers 136, 137 are chosen so that contact with the CMOS wafer is made while forming a reliable solder joint, as discussed above.) The carrier plate is then removed, preferably by a laser ablation process in which ablating radiation penetrates glass plate 133, causing plate 133 and sheet 132 to detach from polyimide layer 131. The polyimide layer 131 is then removed from cantilever structure 128 by a plasma cleaning process. The resulting structure, including cantilever 128 connected to CMOS device wafer 141, is shown in FIG. 15B. The space behind the cantilever tip is defined by the polyimide support structure 137 (compare FIG. 9D, where cavity 70 is etched behind the cantilever tip).

Figure 15C:
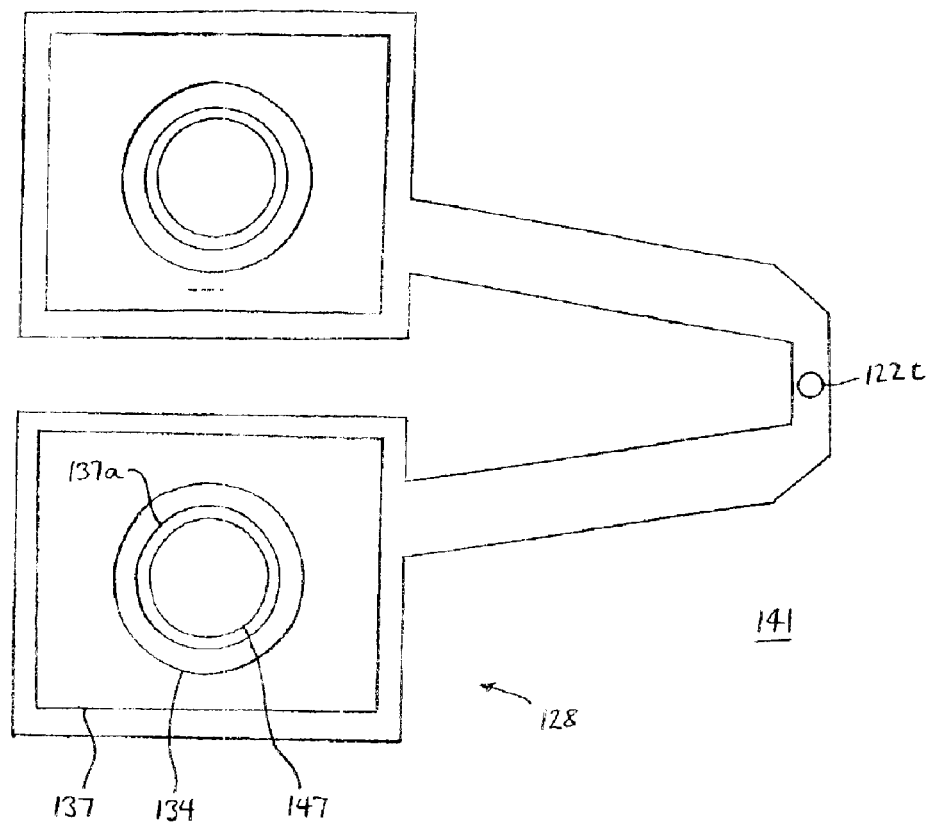
FIG. 15C is a plan view of the integrated MEMS and CMOS devices shown in FIG. 15B.

FIG. 15C is a plan view of the integrated structure shown in cross-section in FIG. 15B. In this embodiment, the polyimide support 137 underlies the anchor portion of the MEMS cantilever structure 128, and has a circular opening (with an interior wall 137a) aligned to the conducting stud formed on the CMOS wafer (the top of which is the solder layer 147).

Alternative Process: MEMS with Backside Conductor and no Polyimide Support

Figure 16A:
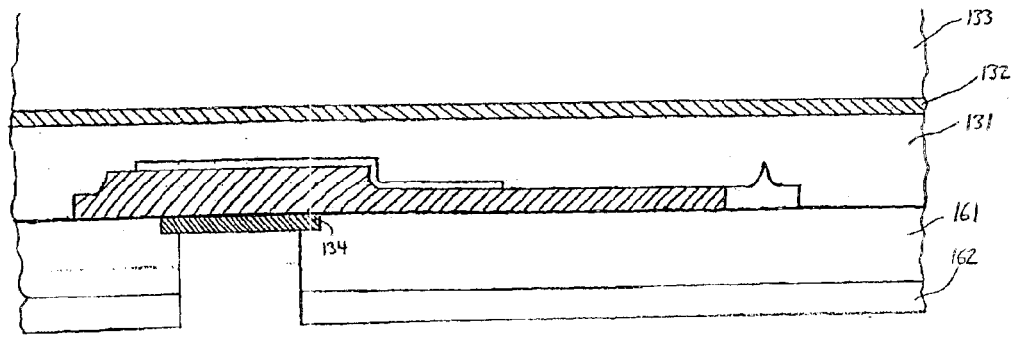
FIGS. 16A–16C illustrate steps in an alternative process for 3-D integration of a MEMS chip having a cantilever with a backside conducting pad and a CMOS chip with an interconnect structure for connecting thereto.
Figure 16B:
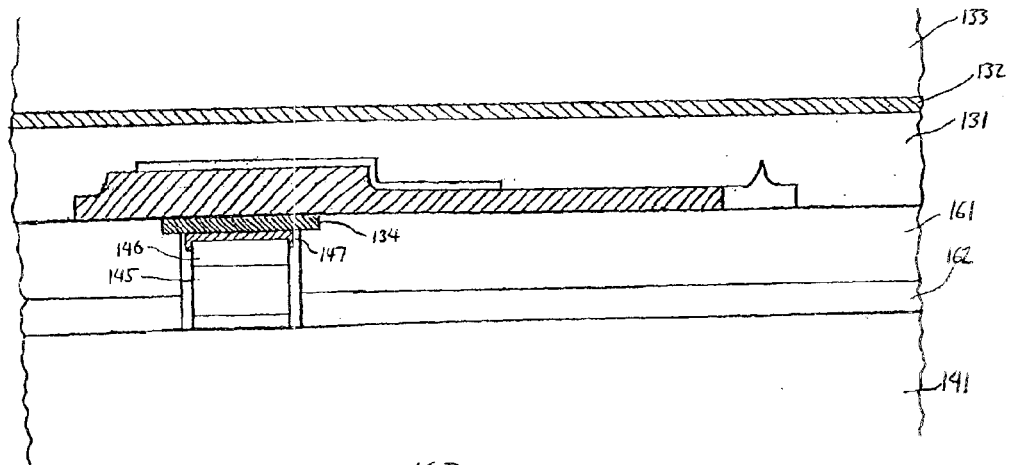
Figure 16C:
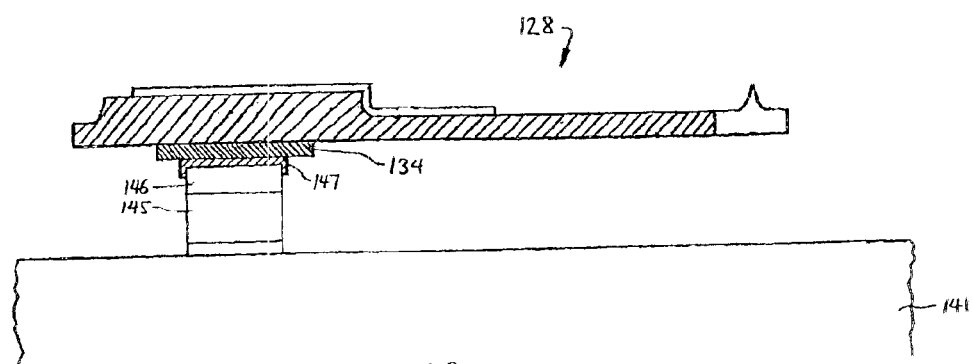

An alternative to the process described just above is shown in FIGS. 16A–16C. After the MEMS device wafer is processed to yield a cantilever structure attached to a carrier plate and with an exposed backside and conducting pad 134 (as shown in FIG. 13B), layers of polyimide 161 and adhesive 162 are deposited on the backside. An opening is formed in layers 161 and 162 to expose the backside conducting pad (see FIG. 16A). This structure is then laminated to the CMOS structure of FIG. 14C; the result of this process is shown in FIG. 16B. The MEMS device and CMOS device are connected through the contact between the solder layer 147 and the conducting pad 134. The carrier plate is then removed as described above. An ashing process is then performed which removes layers 131, 161 and 162.

The resulting structure is shown in FIG. 16C. In this embodiment, the cantilever structure 128 is supported only by the stud formed on the CMOS wafer.

Figure 17A:
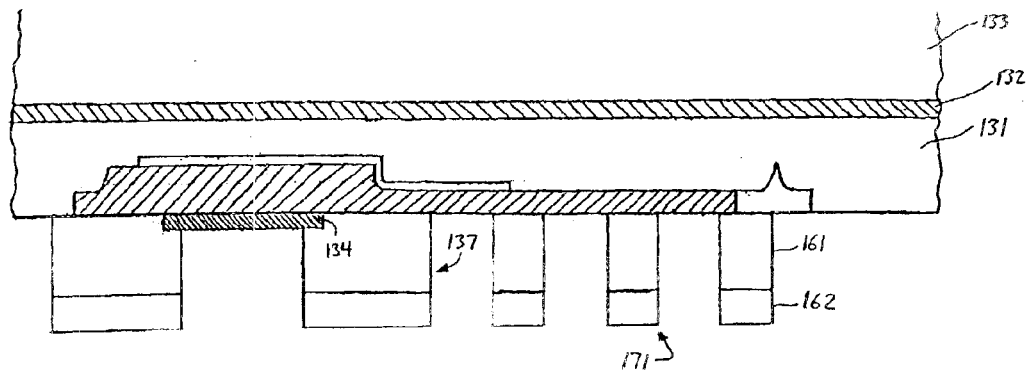
FIGS. 17A and 17B illustrate steps in another alternative process for 3-D integration of a MEMS chip having a cantilever with a backside conducting pad and a CMOS chip with an interconnect structure for connecting thereto.
Figure 17B:
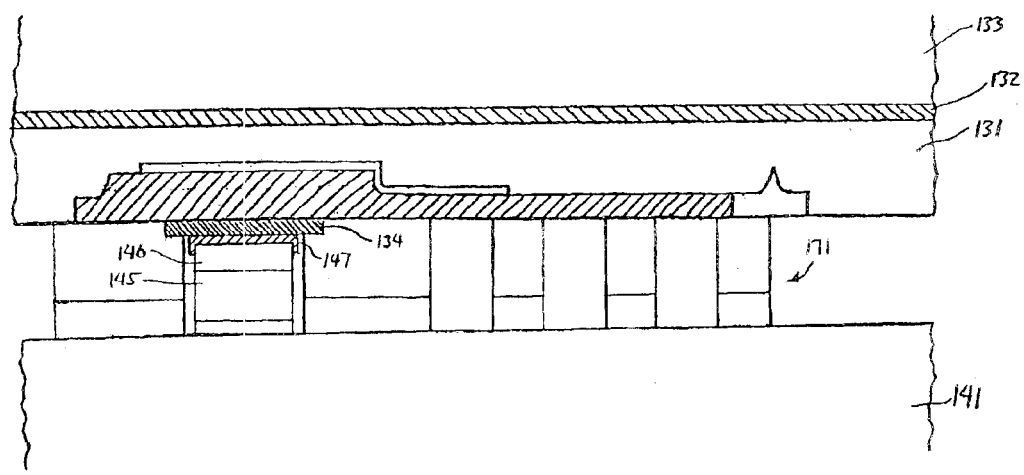

Alternative Process: MEMS with Backside Conductor and Additional Polyimide Support In another alternative process, the polyimide and adhesive layers 161, 162 on the backside of the MEMS structure are patterned to provide a support surrounding the backside conductor 134, and additional supports 171 under the cantilever and tip (see FIG. 17A). The above-described lamination process is then performed with the supporting posts 171 in place (see FIG. 17B). The carrier plate is then removed. An ashing process is then performed in which layer 131 is removed and posts 171 are removed. The support surrounding pad 134 is reduced in size during the ashing process, but not completely removed; the resulting structure is as shown in FIG. 15B.

Figure 18A:
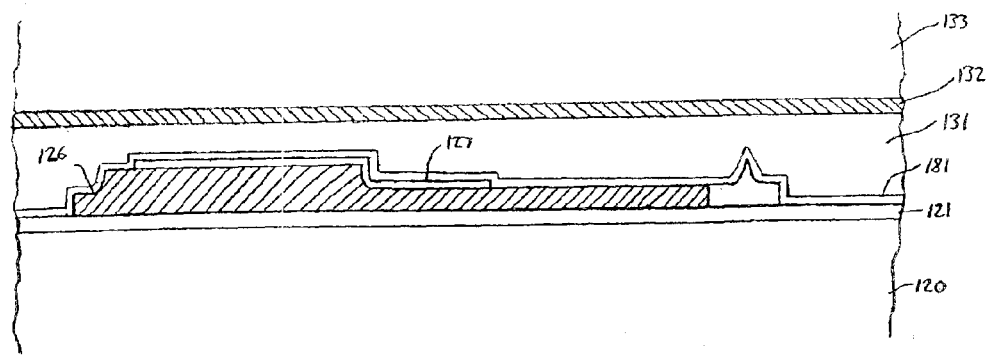
FIGS. 18A–18C illustrate steps in still another alternative process for 3-D integration of a MEMS chip having a cantilever with a backside conducting pad and a CMOS chip with an interconnect structure for connecting thereto.
Figure 18B:
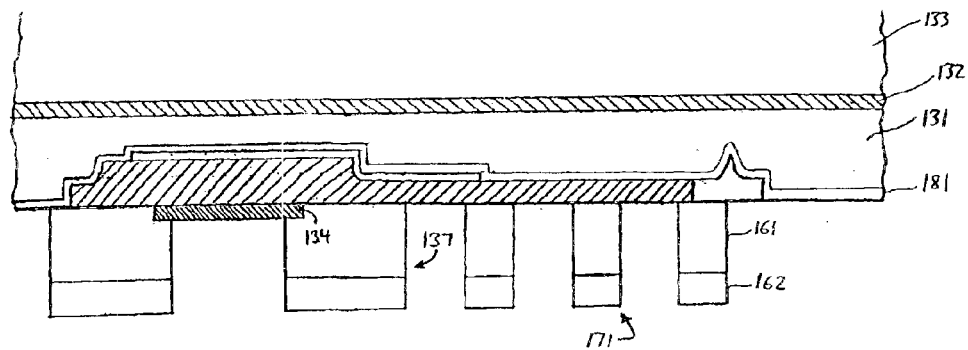
Figure 18C:
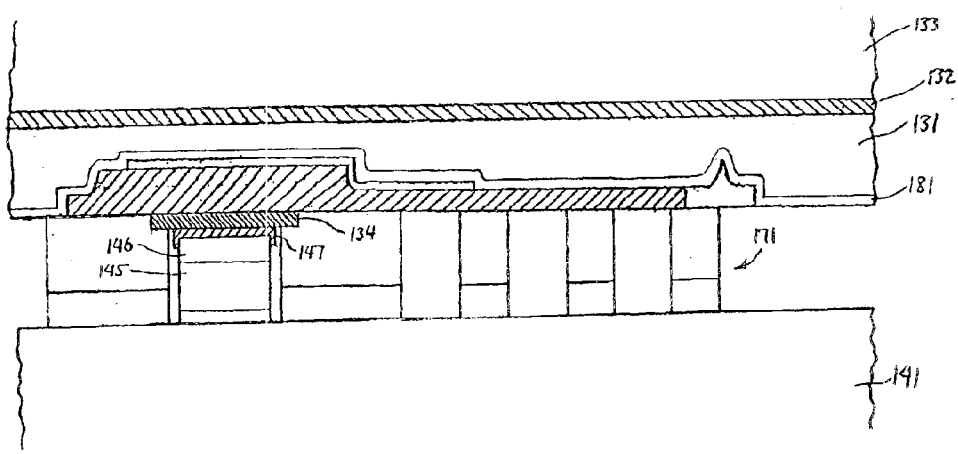

Alternative Process: Addition of Etch Stop Layer to Decouple Top and Bottom Ashing In the processes described above, the polyimide layers both above and below the MEMS device (top side and backside) are removed by the same ashing process. An alternative is shown in FIGS. 18A–18C. During fabrication of the MEMS device, after patterning of the nitride layer 127 but before deposition of the polyimide layer 131 (see FIG. 12E), an etch stop layer 181 is deposited on the top side of the cantilever structure 128. The MEMS device wafer is then attached to a carrier plate as described previously, yielding the structure shown in FIG. 18A. Layer 181 is designed so that it cannot be removed by an ashing process, but can itself be etched without altering the cantilever structure or a polyimide support thereunder. For example, layer 181 may be a low temperature CVD oxide etchable in BHF.

After removal of the bulk silicon 120 and formation of any desired polyimide support structure 171 under the MEMS device (FIG. 18B), layer 181 forms a boundary between polyimide layers above and below the MEMS device. Accordingly, after lamination to the CMOS wafer (FIG. 18C) and removal of the glass plate 133 and sheet 132, layer 131 may be removed by ashing without affecting the polyimide support structures underneath the MEMS device. In this embodiment, two separate ashing processes are performed. In the first ashing process, layer 131 above the MEMS device is removed. The etch stop layer 181 is then removed. The second ashing process is then performed to remove any temporary support structure under the MEMS device. This permits greater control of the support fabrication process, and in particular ensures that temporary supports 171 may be removed while maintaining polyimide support 137 surrounding conducting pad 134. The resulting structure is then as shown in FIG. 15B.

It will be appreciated that the vertical integration techniques of the present invention may be applied to a variety of types of chips, and not merely CMOS and MEMS devices as in the specific embodiments described above. For example, a variety of chip structures may be fabricated from the silicon layer 122 shown in FIG. 12A, and processed to yield structures similar to that shown in FIG. 13E (where the chip structure has a conducting pad 134 on its underside, and is supported on its top side by a temporary carrier plate). Such a structure may then be vertically integrated with a chip of a different type whereon a stud is formed for connection to the conducting pad, yielding an integrated structure as shown in FIG. 15B or 16C.

While the present invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method for fabricating an integrated structure including a micro-electromechanical system (MEMS) and a chip for delivering signals to the MEMS, the method comprising the steps of:

providing a MEMS substrate having a surface;

forming the MEMS on the surface, the MEMS having an anchor portion;

processing at least part of the MEMS including part of the anchor portion so as to form a conductor in the anchor portion;

depositing a first layer overlying the MEMS;

attaching a carrier plate to the first layer;

removing the MEMS substrate after said steps of depositing the first layer and attaching the carrier plate, thereby exposing an underside of the MEMS and the conductor;

forming a conducting structure on the underside of the MEMS in contact with said conductor; and attaching the chip to the anchor portion of the MEMS in a direction normal to said surface, so as to make a conductive path from the chip to the MEMS.

2. A method according to claim 1, wherein said conducting structure is a conducting pad, and further comprising the steps of:

depositing a second layer on the chip;

forming an opening in the second layer; and forming a metal stud in the opening in the second layer, and wherein said step of attaching the chip further comprises aligning the metal stud to the conducting pad on the underside of the MEMS; and performing a lamination process to bond the MEMS to the second layer.

3. A method according to claim 1, wherein said conducting structure is a metal stud, and further comprising the steps of depositing a second layer on the chip;

forming an opening in the second layer; and forming a metal pad in the opening in the second layer; and wherein said step of attaching the chip further comprises aligning the stud to the pad; and performing a lamination process to bond the MEMS to the second layer.

4. A method according to claim 1, wherein the conductor is formed in said processing step by an ion implant process.

5. A method according to claim 1, wherein said step of forming the MEMS further comprises forming a cantilever structure having one end at the anchor portion and another end having a tip extending in the direction normal to the surface.

6. A method for fabricating an integrated structure including a micro-electromechanical system (MEMS) and a chip for delivering signals to the MEMS, the method comprising the steps of:

providing a MEMS substrate having a surface;

forming the MEMS on the substrate, the MEMS having an anchor portion;

depositing a first layer overlying the MEMS;

attaching a carrier plate to the first layer;
removing the MEMS substrate after said steps of depositing the first layer and attaching the carrier plate, thereby exposing an underside of the MEMS;
forming a conducting pad on the underside of the MEMS; and
attaching the chip to the anchor portion of the MEMS, so as to make a conductive path from the chip to the MEMS through the conducting pad in a direction normal to said surface.

7. A method according to claim 6, further comprising the step of forming a metal stud on the chip,
and wherein said attaching step further comprises
aligning the metal stud to the conducting pad; and
performing a lamination process in which the conducting pad of the MEMS is connected to the metal stud.

8. A method according to claim 6, further comprising the steps of:
depositing a second layer on the chip;
forming an opening in the second layer; and
forming the metal stud in the opening in the second layer.

9. A method according to claim 6, wherein the carrier plate is transparent to ablating radiation, and further comprising the steps of:
exposing the carrier plate to ablating radiation, thereby detaching the carrier plate from the first layer; and
removing the first layer,
after said step of attaching the chip.

10. A method according to claim 6, further comprising the step of implanting a dopant material in at least part of the MEMS to form a doped region therein, the conducting pad afterwards being formed in contact with the doped region.

11. A method according to claim 6, further comprising the step of forming a support structure on the underside of the MEMS after forming the conducting pad and before said attaching step, wherein said support structure is brought into contact with the chip during said attaching step and wherein the MEMS is spaced from the chip by a distance corresponding to a height of said support structure.

12. A method according to claim 11, wherein the support structure includes a support which surrounds the metal stud after said attaching step.

13. A method according to claim 11, further comprising the step of removing at least part of said support structure after said attaching step.

14. A method according to claim 6, further comprising the steps of:
forming a support structure of the underside of the MEMS after forming the conducting pad and before said attaching step;
detaching the carrier plate after said attaching step; and
removing the first layer along with at least part of the support structure, after said attaching step.

15. A method according to claim 14, wherein the first layer and the support structure are formed of polyimide, and the first layer and at least part of the support structure are removed in an ashing process.

16. A method according to claim 6, wherein said step of forming the MEMS further comprises forming a cantilever structure having one end at the anchor portion and another end having a tip extending in the direction normal to the surface.

17. A method according to claim 6, wherein the MEMS is formed in a silicon layer overlying an insulator in a silicon-on-insulator (SOI) wafer.

18. A method according to claim 6, further comprising the steps of:
depositing an etch stop layer overlying the MEMS, before said step of depositing the first layer;
forming a support structure on the underside of the MEMS after forming the conducting pad and before said attaching step;
detaching the carrier plate after said attaching step;
removing the first layer after said attaching step;
removing the etch stop layer; and
afterwards removing at least part of the support structure, wherein the etch stop layer is effective to prevent removal of the support structure during said step of removing the first layer.

19. A method for fabricating an integrated structure including a first chip and a second chip, the method comprising the steps of:
forming the first chip on a surface of a substrate;
depositing a first layer overlying the first chip;
attaching a carrier plate to the first layer;
removing the substrate, thereby exposing an underside of the first chip;
forming a conducting pad on the underside of the first chip;
forming the second chip; and
attaching the first chip to the second chip, so as to make a conductive path from the second chip to the first chip through the conducting pad in a direction normal to the underside of the first chip.

20. A method according to claim 19, further comprising the step of forming a metal stud on the second chip, and wherein said step of attaching the first chip to the second chip further comprises
aligning the metal stud to the conducting pad; and
performing a lamination process in which the conducting pad is connected to the metal stud.

21. A method according to claim 20, further comprising the steps of:
depositing a second layer on the second chip;
forming an opening in the second layer; and
forming the metal stud in the opening in the second layer.

22. A method according to claim 19, wherein the carrier plate is transparent to ablating radiation, and further comprising the steps of:
exposing the carrier plate to ablating radiation, thereby detaching the carrier plate from the first layer; and
removing the first layer,
after said step of attaching the first chip to the second chip.

23. A method according to claim 19, further comprising the step of forming a support structure on the underside of the first chip after forming the conducting pad and before said step of attaching the first chip to the second chip, wherein said support structure is brought into contact with the second chip during said attaching step and wherein the first chip is spaced from the second chip by a distance corresponding to a height of said support structure.

24. A method according to claim 23, wherein the support structure includes a support which surrounds the metal stud after said step of attaching the first chip to the second chip.

25. A method according to claim 24, further comprising the step of removing at least part of said support structure after said step of attaching the first chip to the second chip.

26. A method according to claim 20, further comprising the steps of:

forming a support structure on the underside of the first chip after forming the conducting pad and before said step of attaching the first chip to the second chip;

detaching the carrier plate after said attaching step; and removing the first layer along with at least part of the support structure, after said attaching step.

27. A method according to claim 26, wherein the first layer and the support structure are formed of polyimide, and the first layer and at least part of the support structure are removed in an ashing process.

28. A method according to claim 19, wherein the first chip is formed in a silicon layer overlying an insulator in a silicon-on-insulator (SOI) wafer.

29. A method according to claim 19, further comprising the steps of:

depositing an etch stop layer overlying the first chip, before said step of depositing the first layer;

forming a support structure on the underside of the first chip after forming the conducting pad and before said step of attaching the first chip to the second chip;

detaching the carrier plate after said attaching step;

removing the first layer after said attaching step;

removing the etch stop layer; and afterwards removing at least part of the support structure, wherein the etch stop layer is effective to prevent removal of the support structure during said step of removing the first layer.

* * * * *